(12) United States Patent
Lindfors et al.

(10) Patent No.: US 8,741,062 B2
(45) Date of Patent: Jun. 3, 2014

(54) APPARATUS AND METHODS FOR DEPOSITION REACTORS

(75) Inventors: Sven Lindfors, Espoo (FI); Pekka J. Soininen, Espoo (FI)

(73) Assignee: Picosun Oy, Espoo (FI)

( * ) Notice: Subject to any disclaimer, the term of this patent is extended or adjusted under 35 U.S.C. 154(b) by 1006 days.

(21) Appl. No.: 12/148,885

(22) Filed: Apr. 22, 2008

(65) Prior Publication Data

US 2009/0263578 A1    Oct. 22, 2009

(51) Int. Cl.
| | |
|---|---|
| C23C 16/455 | (2006.01) |
| C23C 16/52 | (2006.01) |
| H01L 21/306 | (2006.01) |
| C23F 1/00 | (2006.01) |
| C23C 16/06 | (2006.01) |
| C23C 16/22 | (2006.01) |

(52) U.S. Cl.
USPC .... 118/715; 118/719; 156/345.31; 156/345.3

(58) Field of Classification Search
USPC ............... 118/715, 719; 156/345.31, 345.3
See application file for complete search history.

(56) References Cited

U.S. PATENT DOCUMENTS

| | | | | |
|---|---|---|---|---|
| 3,297,501 | A | * | 1/1967 | Reisman ..................... 117/99 |
| 4,668,480 | A | * | 5/1987 | Fujiyashu et al. ............ 118/719 |
| 5,160,542 | A | * | 11/1992 | Mihira et al. ................ 118/715 |
| 5,284,519 | A | * | 2/1994 | Gadgil ......................... 118/719 |
| 6,202,591 | B1 | * | 3/2001 | Witzman et al. ........ 118/723 VE |
| 2005/0189072 | A1 | | 9/2005 | Chen et al. ............... 156/345.29 |
| 2007/0117383 | A1 | | 5/2007 | Aitchison et al. ............ 438/680 |

FOREIGN PATENT DOCUMENTS

| | | |
|---|---|---|
| CN | 1475598 A | 2/2004 |
| JP | 61-15971 A | 1/1986 |
| JP | 10-140356 A | 5/1998 |
| JP | 2000-226667 A | 8/2000 |
| WO | WO 2006/111618 A1 | 10/2006 |

OTHER PUBLICATIONS

Knez, M., et al., "Synthesis and Surface Engineering of Complex Nanostructures by Atomic Layer Deposition", © 2007, Wiley-VCH, pp. 3425-3438.
Puurunen, R.L., "Surface Chemistry of Atomic Layer Deposition: a case study for the trimethyaluminum/water process", Mar. 18, 2005, 55 pgs.
Ritala, M., et al., "Atomic Layer Deposition", © 2002, Handbook of Thin Film Materials, vol. 1, Deposition and Processing of Thin Films, pp. 103-159.
Suntola, T., "Atomic Layer Epitaxy", © 1994, Handbook of Crystal Growth, vol. 3, pp. 601-663.
Suntola, T., "Atomic Layer Epitaxy", 1989, Materials Science Reports, North-Holland, Amsterdam, pp. 261-312.
Office Action. Notification of Ground of Rejection. Japan Patent Application No. 2011-505541. Aug. 20, 2013.

* cited by examiner

*Primary Examiner* — Rudy Zervigon
(74) *Attorney, Agent, or Firm* — Ziegler IP Law Group, LLC.

(57) ABSTRACT

An apparatus, such as an ALD (Atomic Layer Deposition) apparatus, including a precursor source configured for depositing material on a heated substrate in a deposition reactor by sequential self-saturating surface reactions. The apparatus includes an in-feed line for feeding precursor vapor from the precursor source to a reaction chamber and a structure configured for utilizing heat from a reaction chamber heater for preventing condensation of precursor vapor into liquid or solid phase between the precursor source and the reaction chamber. Also various other apparatus and methods are presented.

19 Claims, 22 Drawing Sheets

APPARATUS AND METHODS FOR DEPOSITION REACTORS

FIELD OF THE INVENTION

The present invention generally relates to apparatus and methods for deposition reactors. More particularly, but not exclusively, the invention relates to precursor sources, apparatus and methods for such deposition reactors in which material is deposited on surfaces by sequential self-saturating surface reactions.

BACKGROUND OF THE INVENTION

Atomic Layer Epitaxy (ALE) method was invented by Dr. Tuomo Suntola in the early 1970's. Another generic name for the method is Atomic Layer Deposition (ALD) and it is nowadays used instead of ALE. ALD is a special chemical deposition method based on the sequential introduction of at least two reactive precursor species to a substrate that is located within a heated reaction space. The growth mechanism of ALD relies on the bond strength differences between chemical adsorption (chemisorption) and physical adsorption (physisorption). ALD utilizes chemisorption and eliminates physisorption during the deposition process. During chemisorption a strong chemical bond is formed between atom(s) of a solid phase surface and a molecule that is arriving from the gas phase. Bonding by physisorption is much weaker because only van der Waals forces are involved. Physisorption bonds are easily broken by thermal energy when the local temperature is above the condensation temperature of the molecules.

By definition the reaction space of an ALD reactor comprises all the heated surfaces that can be exposed alternately and sequentially to each of the ALD precursor used for the deposition of thin films. A basic ALD deposition cycle consists of four sequential steps: pulse A, purge A, pulse B and purge B. Pulse A typically consists of metal precursor vapor and pulse B of non-metal precursor vapor, especially nitrogen or oxygen precursor vapor. Inactive gas, such as nitrogen or argon, and a vacuum pump are used for purging gaseous reaction by-products and the residual reactant molecules from the reaction space. A deposition sequence comprises at least one deposition cycle. Deposition cycles are repeated until the deposition sequence has produced a thin film of desired thickness.

Precursor species form through chemisorption a chemical bond to reactive sites of the heated surfaces. Conditions are typically arranged in such a way that no more than a molecular monolayer of a solid material forms on the surfaces during one precursor pulse. The growth process is thus self-terminating or saturative. For example, the first precursor can include ligands that remain attached to the adsorbed species and saturate the surface, which prevents further chemisorption. Reaction space temperature is maintained above condensation temperatures and below thermal decomposition temperatures of the utilized precursors such that the precursor molecule species chemisorb on the substrate(s) essentially intact. Essentially intact means that volatile ligands may come off the precursor molecule when the precursor molecules species chemisorb on the surface. The surface becomes essentially saturated with the first type of reactive sites, i.e. adsorbed species of the first precursor molecules. This chemisorption step is typically followed by a first purge step (purge A) wherein the excess first precursor and possible reaction by-products are removed from the reaction space. Second precursor vapor is then introduced into the reaction space. Second precursor molecules typically react with the adsorbed species of the first precursor molecules, thereby forming the desired thin film material. This growth terminates once the entire amount of the adsorbed first precursor has been consumed and the surface has essentially been saturated with the second type of reactive sites. The excess of second precursor vapor and possible reaction by-product vapors are then removed by a second purge step (purge B). The cycle is then repeated until the film has grown to a desired thickness. Deposition cycles can also be more complex. For example, the cycles can include three or more reactant vapor pulses separated by purging steps. All these deposition cycles form a timed deposition sequence that is controlled by a logic unit or a microprocessor.

Thin films grown by ALD are dense, pinhole free and have uniform thickness. For example, aluminum oxide grown from trimethylaluminum $(CH_3)_3Al$, also referred to as TMA, and water at 250-300° C. has usually about 1% non-uniformity over the 100-200 mm wafer. Metal oxide thin films grown by ALD are suitable for gate dielectrics, electroluminescent display insulators, capacitor dielectrics and passivation layers. Metal nitride thin films grown by ALD are suitable for diffusion barriers, e.g., in dual damascene structures. Precursors for the ALD growth of thin films and thin film materials deposited by the ALD method are disclosed, for example, in a review article M. Ritala et al., "*Atomic Layer Deposition*" *Handbook of Thin Film Materials, Volume* 1: *Deposition and Processing of Thin Films, Chapter* 2, Academic Press, 2002, p. 103, and R. Puurunen, "*Surface chemistry of atomic layer deposition: A case study for the trimethylaluminium/water process*", *Journal of Applied Physics*, vol. 97 (2005) pp. 121301-121352 which are incorporated herein by reference.

Apparatuses suited for the implementation of ALE and ALD methods are disclosed, for example, in review articles T. Suntola, "*Atomic Layer Epitaxy*", *Materials Science Reports*, 4(7) 1989, Elsevier Science Publishers B. V., p. 261, and T Suntola, "*Atomic Layer Epitaxy*", *Handbook of Crystal Growth* 3, *Thin Films and Epitaxy, Part B: Growth Mechanisms and Dynamics, Chapter* 14, Elsevier Science Publishers B. V., 1994, p. 601 which are incorporated herein by reference.

A precursor source is disclosed in U.S. patent application publication no. US 2007/0117383 A1, which is incorporated herein by reference.

Another precursor source is disclosed in WO patent application publication no. WO 2006/111618 A1, also incorporated herein by reference.

Various existing precursor sources have a number of problems. One general problem is that preventing the condensation of precursor vapor in source chemical lines has required complicated and expensive heating systems. Another general problem is that preventing crust formation on the solid precursor surface has required complicated source structures. Still another general problem is that existing precursor sources are very bulky and service of the precursor source has been time-consuming.

SUMMARY

According to a first aspect of the invention there is provided an apparatus comprising:
a precursor source configured for depositing material on a heated substrate in a deposition reactor by sequential self-saturating surface reactions;
an in-feed line for feeding precursor vapor from the precursor source to a reaction chamber comprised by the reactor containing the substrate; and a structure configured for utilizing heat from a reaction chamber heater for preventing condensation of precursor vapor into liquid or solid phase between the precursor source and the reaction chamber.

There may be one or more substrates.

In an embodiment, the precursor source comprises a protrusion configured for receiving heat from the reactor. In an embodiment, the apparatus comprises an internal neck in the protrusion and an outer neck around the protrusion, the internal neck and the outer neck forming a gap there between. In an embodiment, the apparatus comprises a heat conductor tube around the in-feed line configured for decreasing thermal energy loss from the protrusion to the surroundings.

In an embodiment, the apparatus comprises a source framework configured for receiving a detachably attachable (or removable) source cartridge.

In an embodiment, the apparatus comprises a heater for heating the source cartridge or source block.

According to a second aspect of the invention there is provided an apparatus comprising:
a precursor source configured for depositing material on a heated substrate in a deposition reactor by sequential self-saturating surface reactions;
two pulsing valves embedded into the precursor source configured to control feeding of precursor vapor from the precursor source to a reaction chamber comprised by the reactor containing the substrate; and
a bypass line between the pulsing valves for feeding inactive gas from a pulsing valve to another pulsing valve.

In an embodiment, the apparatus comprises a flow restrictor in the bypass line.

According to a third aspect of the invention there is provided an apparatus comprising:
a precursor source configured for depositing material on a heated substrate in a deposition reactor by sequential self-saturating surface reactions;
a pulsing valve embedded into the precursor source configured to control feeding of precursor vapor from the precursor source to a reaction chamber comprised by the reactor containing the substrate, the apparatus being configured to:
convey inactive gas via the pulsing valve to a precursor source cartridge to raise pressure and to ease subsequent flow of a mixture of precursor vapor and inactive gas towards the reaction chamber.

In an embodiment, the apparatus is configured to:
close the precursor cartridge after the pressure raise until the commencement of a next precursor pulse period, and further configured to:
open a route towards the reaction chamber via the pulsing valve upon commencement of the next precursor pulse period.

According to a fourth aspect of the invention there is provided a precursor source comprising:
a detachably attachable precursor cartridge;
a first fitting configured for attaching and detaching the precursor cartridge to and from the precursor source; and
a second fitting for attaching and detaching the precursor source to and from the deposition reactor device.

In an embodiment, the precursor source comprises a particle filter in connection with the first fitting. In an embodiment, the precursor source comprises a sealing part or valve configured for sealing the precursor cartridge to prevent precursor material flow from inside the precursor cartridge to the first fitting.

In an embodiment, the precursor source comprises:
a third fitting on a first side of the sealing part or valve; and
a fourth fitting on another side of the sealing part or valve, wherein
said third and fourth fittings are configured to open for detaching said sealing part or valve and for cleaning the cartridge.

According to a fifth aspect of the invention there is provided a precursor cartridge comprising:
a precursor boat comprising precursor material; and
a sinter cartridge for receiving said the precursor boat loaded therein.

In an embodiment, the precursor boat loaded with source chemical is horizontally arranged to enter the sinter cartridge via a loading port.

According to a sixth aspect of the invention there is provided a method comprising:
feeding precursor vapor along an in-feed line from a precursor source of a deposition reactor to a reaction chamber containing a heated substrate;
depositing material on the heated substrate in the deposition reactor by sequential self-saturating surface reactions; and
using heat from a reaction chamber heater for preventing condensation of precursor vapor into liquid or solid phase between the precursor source and the reaction chamber.

In an embodiment, the method comprises receiving heat from the reactor into a protrusion in the source, the protrusion having the in-feed line, wherein said received heat heats the in-feed line.

In an embodiment, the method comprises arranging a heat conductor part around the in-feed line for decreasing thermal energy loss from the protrusion to the surroundings.

According to a seventh aspect of the invention there is provided a method comprising:
depositing material on a heated substrate in a deposition reactor by sequential self-saturating surface reactions;
controlling feeding of precursor vapor from a precursor source to a reaction chamber comprised by the reactor containing the substrate with two pulsing valves embedded into the precursor source; and
feeding inactive gas from a pulsing valve to another pulsing valve via a bypass line.

According to an eighth aspect of the invention there is provided a method comprising:
depositing material on a heated substrate in a deposition reactor by sequential self-saturating surface reactions;
controlling feeding of precursor vapor from a precursor source to a reaction chamber comprised by the reactor containing the substrate with a pulsing valve embedded into the precursor source; and
conveying inactive gas via the pulsing valve to a precursor source cartridge to raise pressure and to ease subsequent flow of a mixture of precursor vapor and inactive gas towards the reaction chamber.

According to an ninth aspect of the invention there is provided a method comprising:
operating a precursor source; and
receiving a horizontal precursor boat loaded with source chemical into a sinter cartridge of the precursor source.

According to yet another aspect of the invention there is provided a detachably attachable precursor cartridge for use in the precursor source of any other aspect.

In an embodiment, a precursor source for the deposition of material on a substrate is provided, the precursor source comprising: a framework for attaching dosage valves, a framework for attaching precursor cartridge, a feed-through conduit, at least one dosage valve, integral by-pass flow conduit; and a removable precursor cartridge.

In another embodiment, a precursor source for the deposition of material on a substrate is provided, the precursor source comprising: a framework for attaching dosage valves and housing a precursor volume, a feed-through conduit, at least one dosage valve; and integral by-pass flow conduit.

The apparatus, sources, precursor cartridges and methods may be intended for growing material or thin films on heated surfaces by sequential self-saturating surface reactions below the atmospheric pressure, the apparatus thereby being an ALD (Atomic Layer Deposition) or ALE (Atomic Layer Epitaxy) apparatus or similar. The desired thickness of the thin films would typically be in the area extending from one monolayer or molecular layer up to 1000 nm or further.

The apparatus, sources, source cartridges and methods may be intended for generating source chemical vapor for growing material or thin films on heated surfaces by sequential self-saturating surface reactions below the atmospheric pressure. Source chemical vapor may be generated, for example, by heating solid or liquid chemicals. They may, for example, have a vapor pressure of less than about 10 hPa at room temperature.

Certain embodiments provide a modular precursor source for deposition reactors that has a simplified heating system. Certain embodiments provide a modular precursor source that has controlled temperature gradient over the source for preventing crust formation. Certain embodiments provide a modular precursor source that has compact footprint.

In certain embodiments precursor sources are used that generate vapor from solid or liquid chemicals at elevated temperatures. Certain embodiments relate to apparatus and methods for generating source chemical vapor from low vapor pressure precursors.

According to an embodiment a heated precursor source comprises a removable precursor cartridge, and means of heating the precursor source with an embedded heating system. The heated precursor source may comprise means of cooling the precursor source with controlled removal of heat from a selected area of the precursor source for creating a temperature gradient over the precursor source. The heated precursor source may comprise a structure for utilizing reaction chamber heat for preventing the condensation of precursor vapor into liquid or solid phase between the precursor source and the reaction chamber.

It should be clear for a skilled person that the various aspects, although presented as separate aspects, can be combined in any suitable way. Also, the embodiments disclosed in the specification and the subject-matter of dependent claims relating to one aspect can be applied to other aspects of the invention. Furthermore, an embodiment of a certain aspect can be combined with other embodiment(s) of the same aspect in any suitable way.

BRIEF DESCRIPTION OF THE DRAWINGS

In the following, the invention will be described in more detail with the help of exemplifying embodiments illustrated in the appended drawings, in which like reference numbers are employed for similar features in different embodiments and, in which.

DETAILED DESCRIPTION

Without wishing to be restricted by the following explanations and theoretical considerations, embodiments of the invention will now be described in detail with the help of figures and examples. The scope of the invention is not meant to be limited to these figures and examples. A person skilled in the art will understand that variations of the apparatuses and the methods can be constructed without departing from the scope of the invention.

Figure 1:
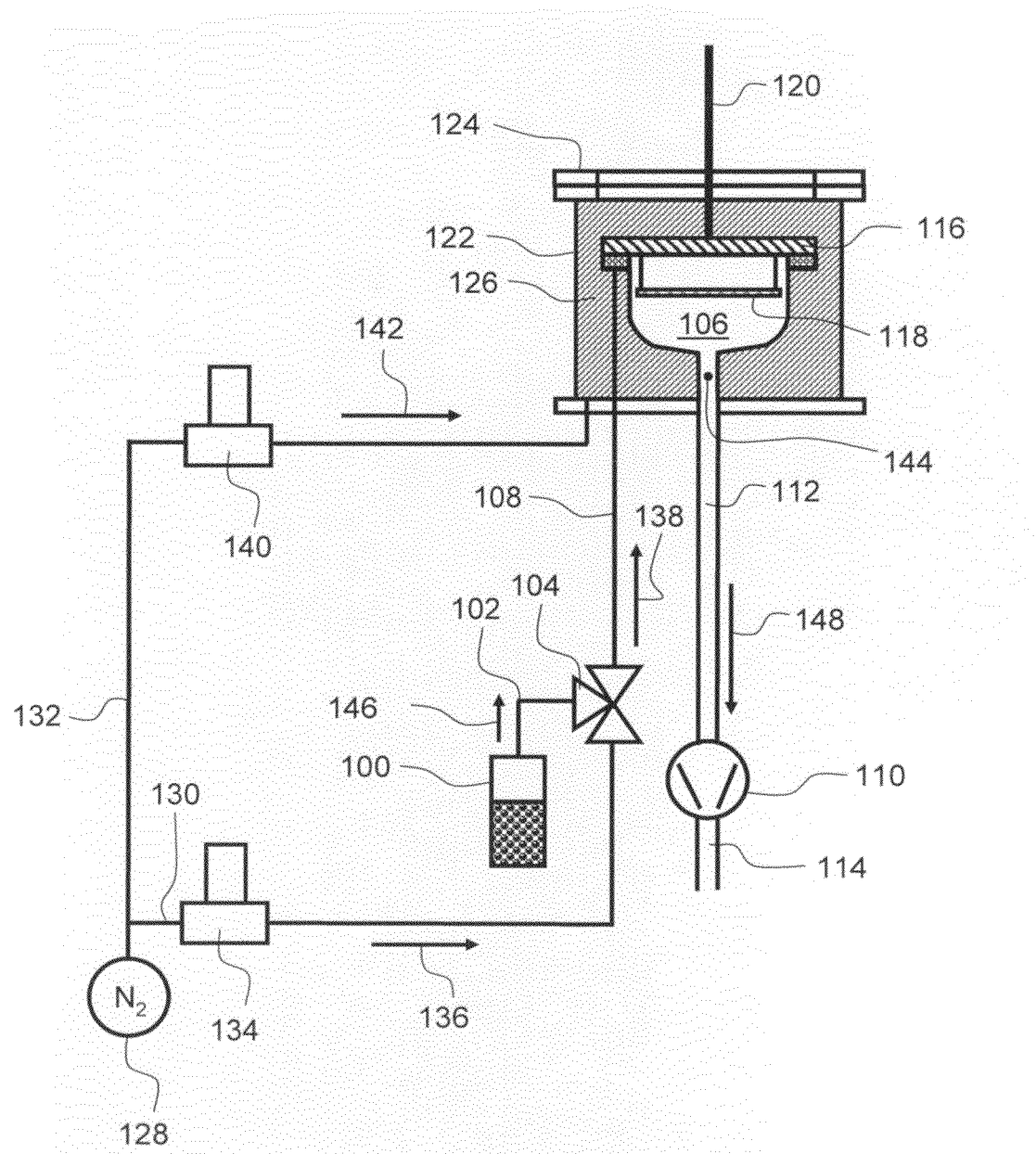
FIG. 1 is a schematic drawing of a prior art construction where a non-heated liquid source system has been attached to a deposition reactor.

FIG. 1 depicts a schematic view of a non-heated liquid precursor source 100 during a pulse time. The source 100 is controlled with a pulsing valve 104. During a pulse time the pulsing valve 104 is opened. Liquid precursor evaporates inside the source 100 generating precursor vapor. Precursor vapor has high enough pressure for entering the in-feed line (or in-feed conduit) 108 through the opened pulsing valve 104. Precursor vapor flows along the conduit 102 as indicated with the arrow 146, through the pulsing valve 104 and along the in-feed conduit 108 as indicated with the arrow 138. The precursor vapor arrives to a heated reaction chamber 106 that houses a substrate holder 118. The reaction chamber 106 is sealed with a reaction chamber lid 116 from an intermediate space 126. The reactor 122 is sealed against room air with a vacuum chamber lid 124. Precursor vapor chemisorbs on all heated surfaces inside the reaction chamber 106. The surfaces become saturated with up to one molecular layer of the precursor vapor. Surplus precursor vapor and surface reaction byproducts flow from the reaction chamber 106 through an exhaust line 112 to a vacuum pump 110 as indicated with an arrow 148. The vacuum pump 110 compresses the gases and compressed gases exit the vacuum pump 110 to an outlet conduit 114. Inactive gas, e.g., nitrogen gas is used as carrier and purge gas. Inactive gas flow coming from an inactive gas source 128 is divided into two parts. One part of the flow is directed through an intermediate space conduit 132 and the other part of the flow is directed to a source line conduit 130. The flow rate of inactive gas going to the intermediate space 126 is controlled with a first mass flow controller 140. Inactive gas escapes from the intermediate space 126 to the exhaust line 112 through a flow restrictor 144. The flow rate of inactive gas going to the reaction chamber 106 is controlled with a second mass flow controller 134. Inactive gas pushes precursor vapor from the pulsing valve 104 towards the reaction chamber 106. The substrate holder 118, the reaction chamber lid 116 and the vacuum chamber lid 124 are controlled with a lifting mechanism 120.

Figure 2:
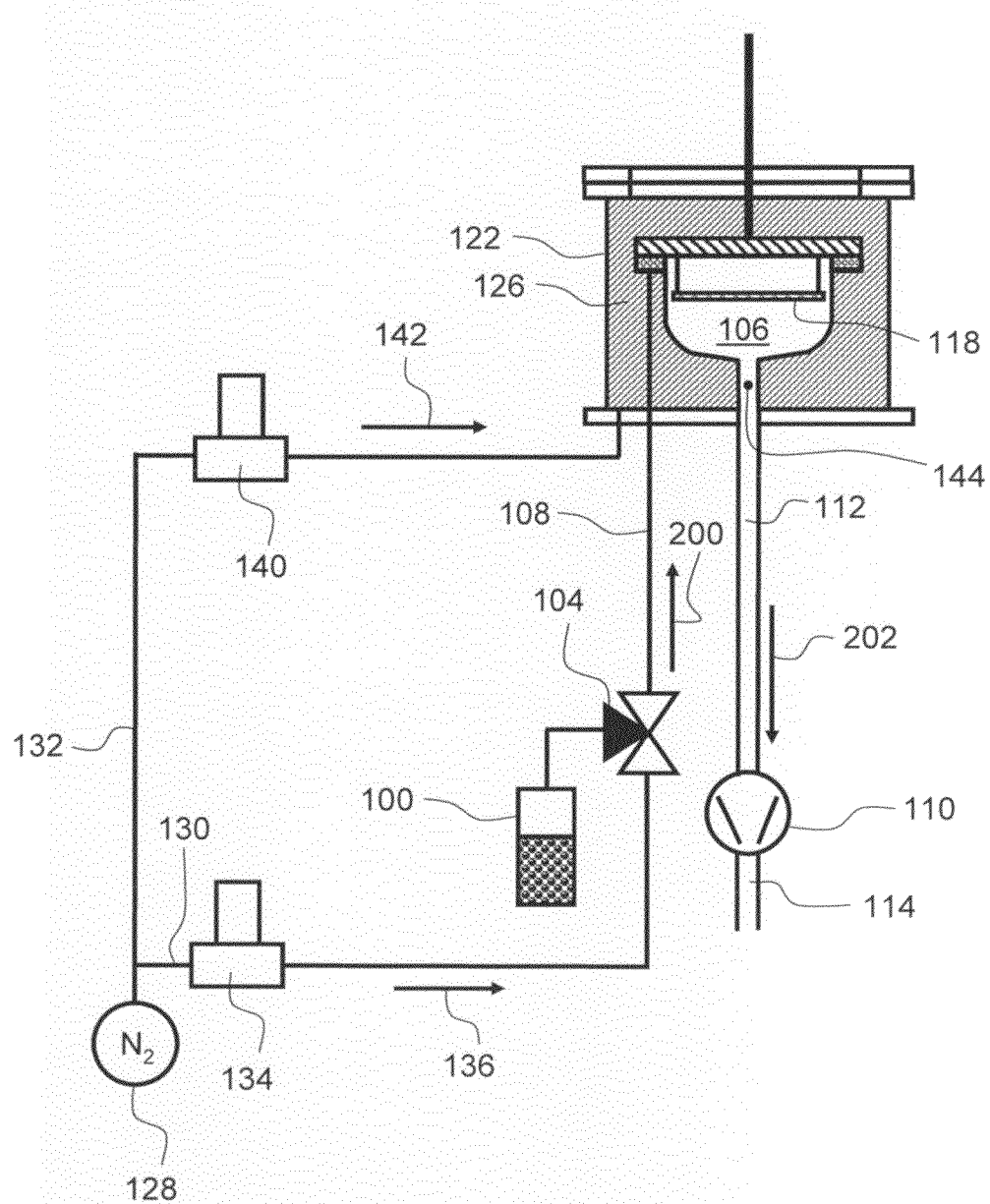
FIG. 2 is another schematic drawing of a prior art construction where a non-heated liquid source system has been attached to a deposition reactor.

FIG. 2 depicts a schematic view of a non-heated liquid precursor source 100 during a purge time. The pulsing valve 104 has been closed. The liquid precursor source 100 has been isolated from the in-feed conduit 108. Inactive gas purges residual precursor vapor towards the reaction chamber 106. Purging cleans the gas phase of the in-feed conduit 108. After that only pure inactive gas flows along the in-feed line/conduit 108 as indicated with an arrow 200. Inactive gas also purges the reaction chamber 106 and cleans the gas phase of the reaction chamber from residual precursor vapor and gaseous byproducts originating from surface reactions. All gases inside the reaction chamber and the intermediate space will finally enter the exhaust line 112 and flow towards the vacuum pump 110 as indicated with the arrow 202.

Figure 3:
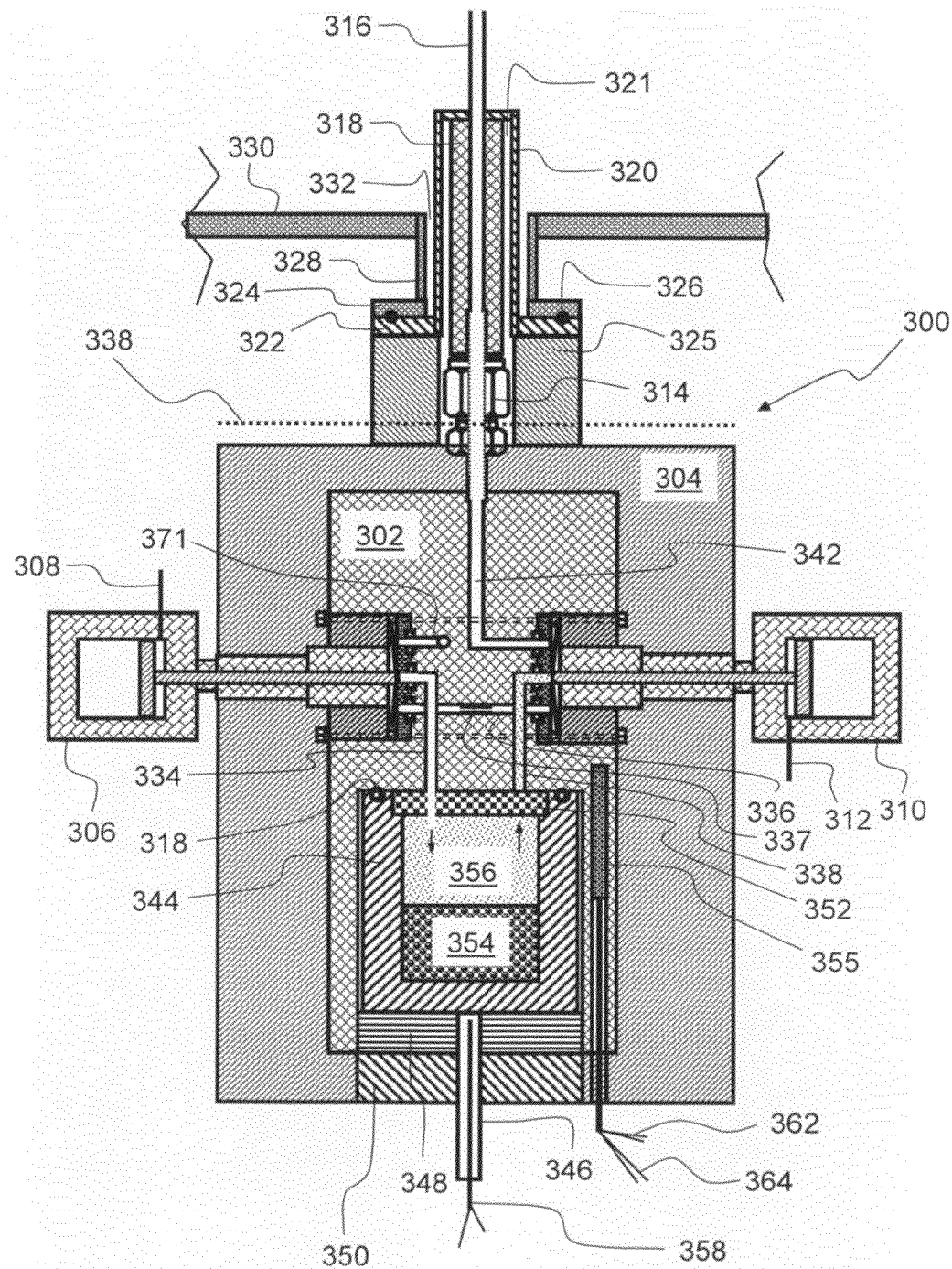
FIG. 3 is a schematic drawing of a heated precursor source that has two dosage valves.

FIG. 3 depicts a schematic view of a heated dual valve source 300 (or source system) that can be used for vaporizing low vapor pressure precursors. The source 300 comprises a thermally conductive source framework 302, a thermally insulating cover 304, a first pulsing valve 306 with control system 308, a second pulsing valve 310 with a control system 312 and a precursor cartridge 344. The precursor cartridge 344 when heated typically contains precursor in solid or liquid phase 354 and in gas phase 356. The control systems 308, 312 are typically based on pneumatic or electrical controlling methods. The source framework 302 is tightened with a conduit connector 314 to a reaction chamber in-feed line 316. A protrusion exploits thermal energy of the reactor. The term reactor comprises here both a vacuum chamber and a reaction chamber. The protrusion comprises an internal neck 320, an outer neck 328 and a neck connector comprising a pair of flanges 322, 324 with a seal 326 between the said flanges for attaching the protrusion to a vacuum chamber wall 330. A vacuum gap 332 between the outer neck 328 and the internal neck 320 increases the path length for the thermal energy flow and decreases thermal energy loss from the protrusion to the surrounding room atmosphere and to the cool vacuum chamber wall 330. An air gap 321 between the internal neck 320 and a coaxial heat conductor tube 318 increases the length of the path for the thermal energy flow and decreases thermal energy loss from the protrusion to the surrounding atmosphere and to the cool vacuum chamber wall 330. A heater (not shown) placed in the vacuum chamber heats the internal neck 320 and the in-feed conduit 316 of the protrusion. Heat energy flow is divided into two parts. The first part of the heat energy flow moves by conduction along the first route from the internal neck 320 and the in-feed conduit 316 towards the connector 314 along the in-feed conduit 316 and the heat conductor tube 318. The second part of the heat energy flow moves mostly by conduction along the second route from the internal neck 320, through the flanges 322, 324 and along the outer neck 328 to the vacuum chamber wall 330. A coaxial heat insulator pad 325 limits the entry of the second part of the heat energy flow into the thermally insulating cover 304. The first route keeps the in-feed conduit heated between the ALD reactor and the precursor source. The second route is as long as possible and has as small thermal conductivity as possible to minimize thermal losses from the in-feed conduit 316 to the vacuum chamber wall 330.

The heated precursor source 300 is detached from the ALD reactor or attached to the ALD reactor with the conduit connector 314, the attachment/detachment level being indicated with a dotted line 338 or with the neck connector. As an example, the conduit connector 314 is a VCR connector with a metal seal between the VCR flanges. As a further example, the conduit connector 314 is a Swagelok connector or a VCO o-ring connector. As an example, the neck connector is a clamped flange connector with an o-ring seal.

Titanium isopropoxide Ti(O$^i$Pr)$_4$ serves as an example of source chemicals that typically should be heated to obtain sufficient precursor vapor pressure. Ti(O$^i$Pr)$_4$ is loaded to a precursor cartridge 344 and an optional particle filter 352 is placed on top of the cartridge 344. According to one embodiment the cartridge 344 is sealed with an o-ring seal 318 against the source framework 302. The cartridge 344 may further be tightened by a tightening nut 348 at the bottom to make a leak-tight connection. The temperature of the cartridge 344 is measured with a first thermocouple 358 attached through a neck 346 of the cartridge 344. The source framework/body 302 is heated with at least one heat source. According to one embodiment the heat source comprises an electrically heated resistor 355. The heat resistor 355 is wired 364 to a computer-controlled power source. The temperature of the heat resistor 355 is measured with a second thermocouple 362. A heat insulating pad 350 limits the heat energy losses from the source cartridge 344 to the room atmosphere. Two pulsing valves 306, 310 are sealed, for example, with metal c-rings or o-rings against the source framework 302. The first pulsing valve 306 serves as source inlet controller for dosing inactive carrier gas (e.g., nitrogen) into the gas phase 356 of the source cartridge 344. The second pulsing valve 310 serves as source outlet controller for dosing precursor vapor mixed with inactive carrier gas to a source outlet conduit 342 and further to the in-feed conduit 316 of the reaction chamber. Pulsing valves 306, 310 are, for example, three-way valves having an open purge conduit through the valve.

During the purge period the valves are closed meaning that the third ports of the valves, i.e. source sides of the valves 306, 310 are kept isolated from the purge conduit of the valves. During the purge period all of the inactive gas flows through the first valve inlet conduit 371, through the purge conduit inside the first valve to the bypass conduit 336 leading to the second valve, through the purge conduit inside the second valve, through the source outlet conduit 342 and through the in-feed conduit 316 to the reaction chamber of the reactor. The bypass conduit may comprise a narrow passage 337 serving as an appropriate flow restrictor. During the pulse time the valves 306, 310 are open meaning that the third ports of the valves, i.e. source sides of the valves 306, 310 are kept in fluid communication with the purge conduits of the valves. During the pulse time the inactive gas flow is divided into two parts. The ratio of inactive gas flows is defined by the ratio of gas flow conductivities. The first part of the inactive gas flow goes from the purge conduit inside the first valve through the cartridge inlet conduit 334 to the gas phase 356 of the cartridge 344. Inactive gas mixes with precursor vapor in the gas phase 356. The resulting gas mixture flows through the cartridge outlet conduit 338 to the purge conduit inside the second valve 310, through the source outlet conduit 342 and through the in-feed conduit 316 to the reaction chamber of the reactor. The second part of the inactive gas flow goes through the purge conduit inside the first valve to the bypass conduit 336 leading to the second valve via the optional narrow passage 337, through the purge conduit inside the second valve where the second part of the inactive gas flow mixes with the gas mixture coming from the cartridge outlet conduit 338, through the source outlet conduit 342 and through the in-feed conduit 316 to the reaction chamber of the reactor.

According to another embodiment the source inlet valve 306 is first opened, inactive gas increases the pressure of the source cartridge 344 and then the source inlet valve 306 is closed. The source outlet valve 310 is subsequently opened and the mixture of inactive gas and precursor vapor flows out of the precursor cartridge and the pressure of the precursor cartridge decreases.

Figure 4:
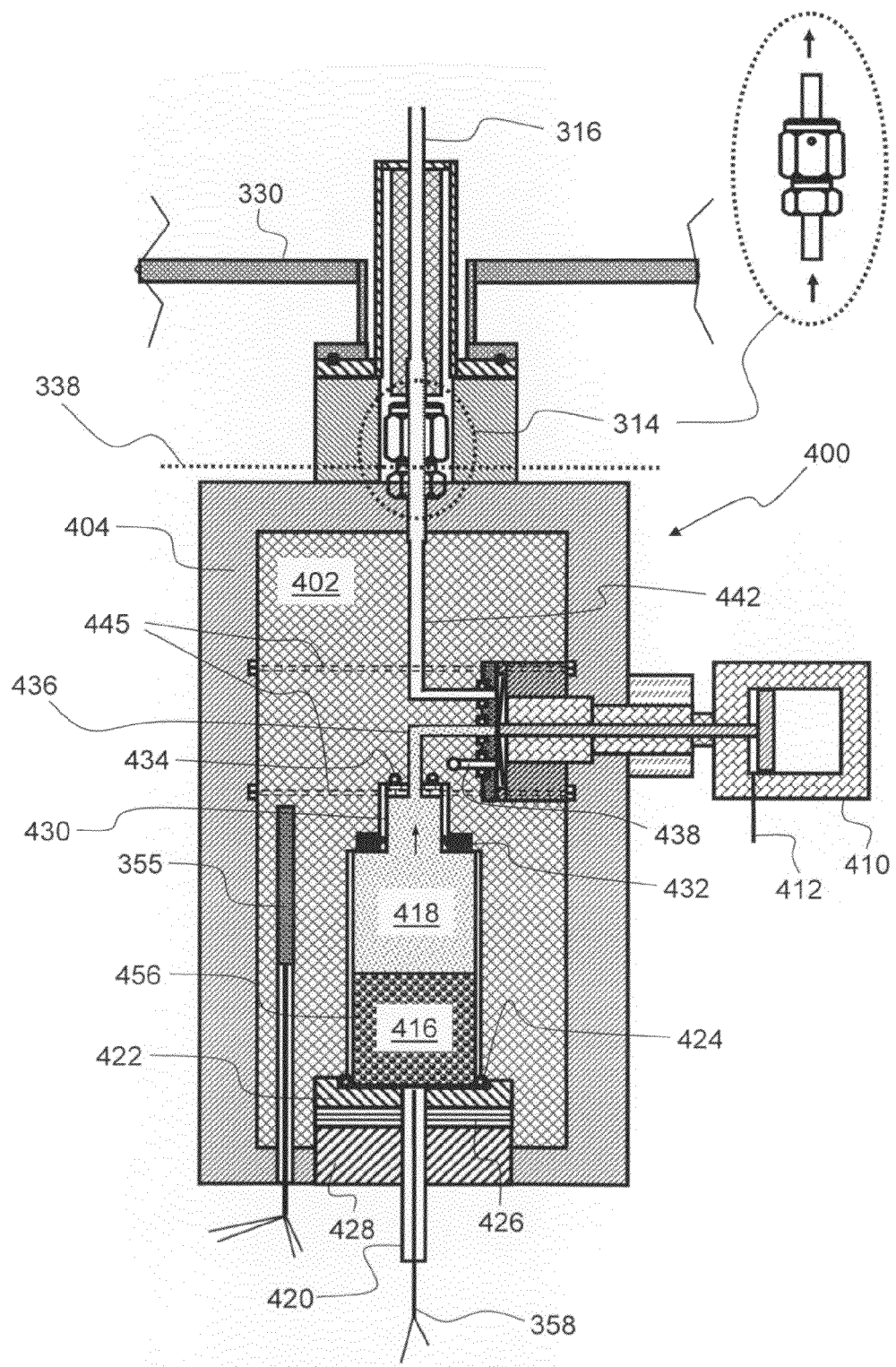
FIG. 4 is a schematic drawing of a heated precursor source that has one dosage valve.

FIG. 4 depicts a schematic view of a heated single valve precursor source 400. The structure of the source 400 comprises a source outlet valve 410 with a control system 412. In an embodiment, the valve 410 is fastened to the source framework 402 by bolts. Reference numeral 445 in the figure indicates holes drilled through the source framework 402 for that purpose. The source framework 402 is covered by the thermally insulating cover 404 and is attached with a connector 314 to the in-feed conduit 316 of the reactor. According to one embodiment the connector 314 is a VCR metal seal connector. The source cartridge comprises a cartridge body 456 and a cartridge neck 430. The source cartridge is sealed against the source framework 402 with an o-ring 424 placed to the cartridge bottom area, a radial shaft seal 432 placed to the cartridge neck area or an o-ring 434 placed to the top area of the cartridge neck 430. A locking/tightening nut 426 is tightened against a seal housing 422 and either the seal housing 422 or the cartridge is pressed against a seal making a leaktight connection. A heat insulating pad 428 limits the heat energy losses from the source cartridge to the room atmosphere. Heated source cartridge loaded with precursor contains precursor in solid or liquid phase 416 and in gas phase 418. If the source 400 comprises the heat source 355, the temperature of the cartridge can be measured with the thermocouple 358 attached through a neck 420 of the cartridge.

During the purge time the pulsing valve 410 is kept closed. Because the purge conduit through the pulsing valve is open all the time, inactive gas flows through the valve inlet conduit 438, through the purge conduit, through the source outlet conduit 442 and through the in-feed conduit 316 towards the reaction chamber.

During the pulse time the source cartridge side of the pulsing valve 410 is opened. Precursor vapor flows along the cartridge outlet conduit 436 through the valve seat of the pulsing valve 410 to the purge conduit of the pulsing valve where the vapor mixes with the inactive gas coming through the valve inlet conduit 438. Thus, precursor vapor is injected into a stream of inactive gas. The resulting precursor vapor and inactive gas mixture flows through the source outlet conduit 442 and through the in-feed conduit 316 towards the reaction chamber.

According to an embodiment the pressure of the inactive gas is about 8 mbar near the valve inlet conduit 438. Precursor is heated to a source temperature where the vapor pressure of the precursor is higher than the pressure of the inactive gas at the injection point inside the pulsing valve. Typically, the source temperature is selected from a range between +40 and +200° C. to obtain at least 10 mbar vapor pressure of the precursor.

Heat energy is lost in a controlled way from the bottom side of the source cartridge. Coldest spot on the surface of the gas volume determines the maximum obtained vapor pressure of the said gas volume. The coldest spot of the precursor source is at the bottom surface of the source cartridge and all other surfaces between the source cartridge and the reaction chamber are at a higher temperature than the bottom surface of the precursor cartridge. These said surfaces are in fluid communication with the source cartridge when the pulsing valve is opened. Condensation of the precursor vapor is avoided on these said surfaces because all the surfaces between the precursor cartridge bottom and the reaction chamber are at a higher temperature that the bottom of the precursor cartridge.

Figure 5:
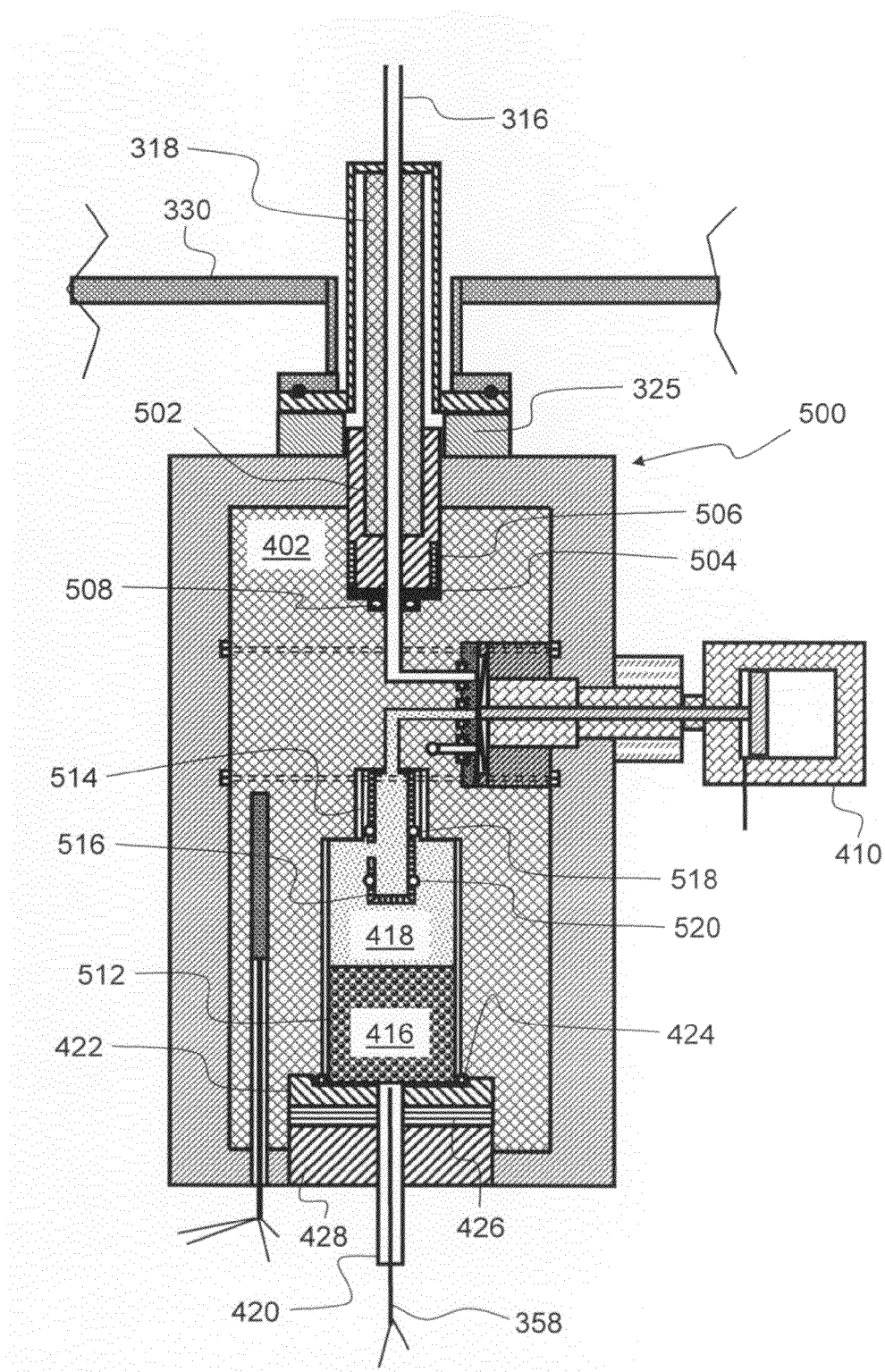
FIG. 5 is a schematic drawing depicting a precursor source that has an internal cartridge sealing.

FIG. 5 depicts a schematic view of a heated source system 500 with a movable source cartridge at an open position. When the pulsing valve 410 is opened, precursor vapor flows from the source cartridge 512 to a source protrusion via a hallway part 516, which has an aperture and forms a hallway towards the pulsing valve 410, and further through the pulsing valve 410 towards the in-feed conduit 316. The cartridge 512 comprises a cartridge neck 514 and the hallway part 516 comprises o-ring seals 518 and 520.

According to one embodiment the source framework 402 is attached with an o-ring seal 508 to the in-feed conduit 316 of the reactor. A flat flange 504 is pressed with a coaxial bolt 502 against the o-ring 508. Reference numeral 506 in the figure indicates threads for the coaxial bolt 502. After removing the coaxial heat insulator pad 318 the coaxial bolt 502 can be loosened by applying a tool (for example a set wrench) to the top part of the coaxial bolt 502.

Figure 6:
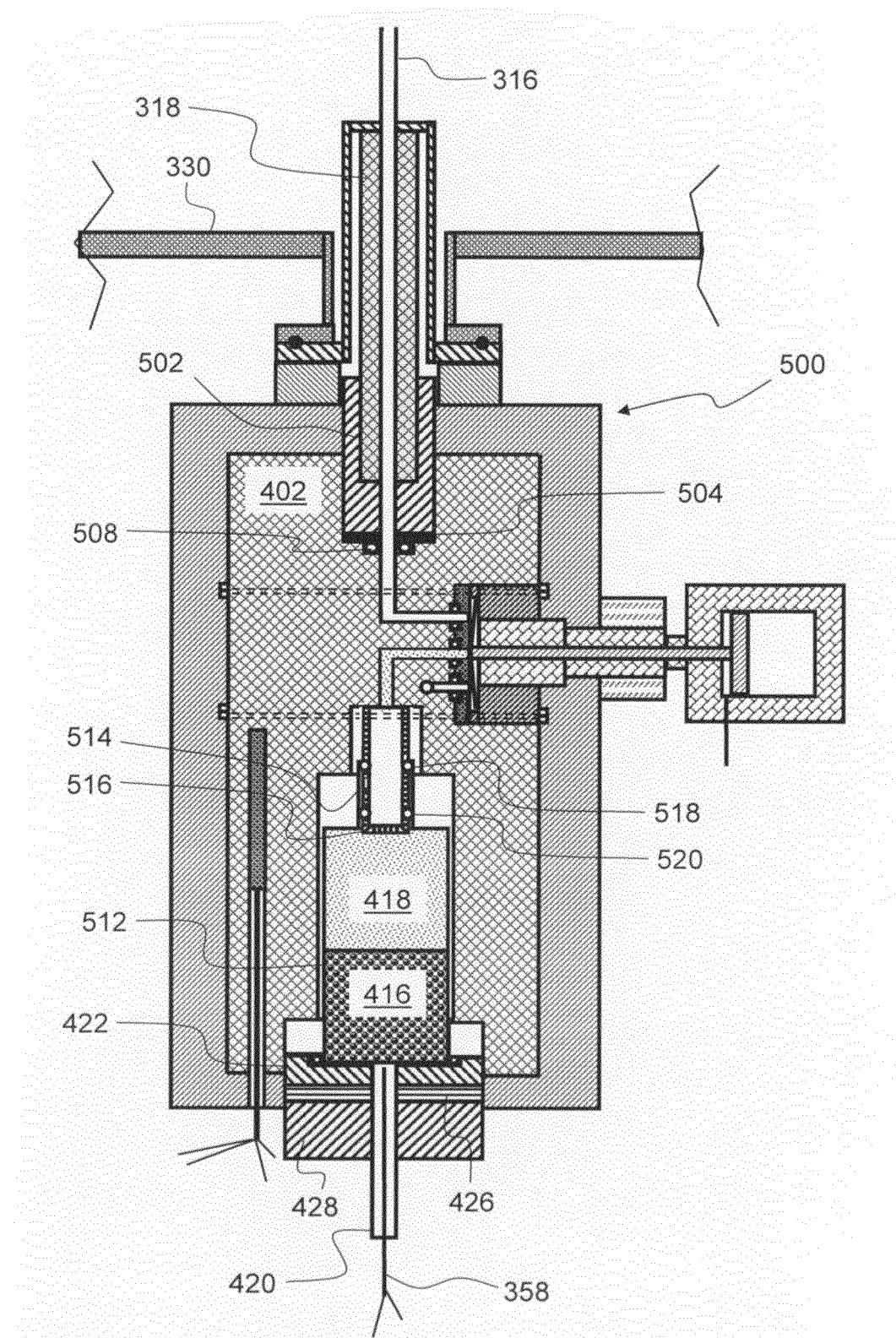
FIG. 6 is another schematic drawing depicting a precursor source that has an internal cartridge sealing.

FIG. 6 depicts a schematic view of the heated source system 500 with a movable source cartridge at closed position. The locking nut 426 has been opened and the source cartridge 512 has been pulled downwards. The cartridge neck 514 is sealed with o-rings 518, 520 and the only outlet opening is in the area sealed with the said o-rings. The precursor vapor volume 418 is effectively isolated from the rest of the source conduits. Because of the isolation of the vapor volume, source chemical vapor can condense only inside the source cartridge when the precursor source system is cooled from source temperature down to room temperature.

Figure 7:
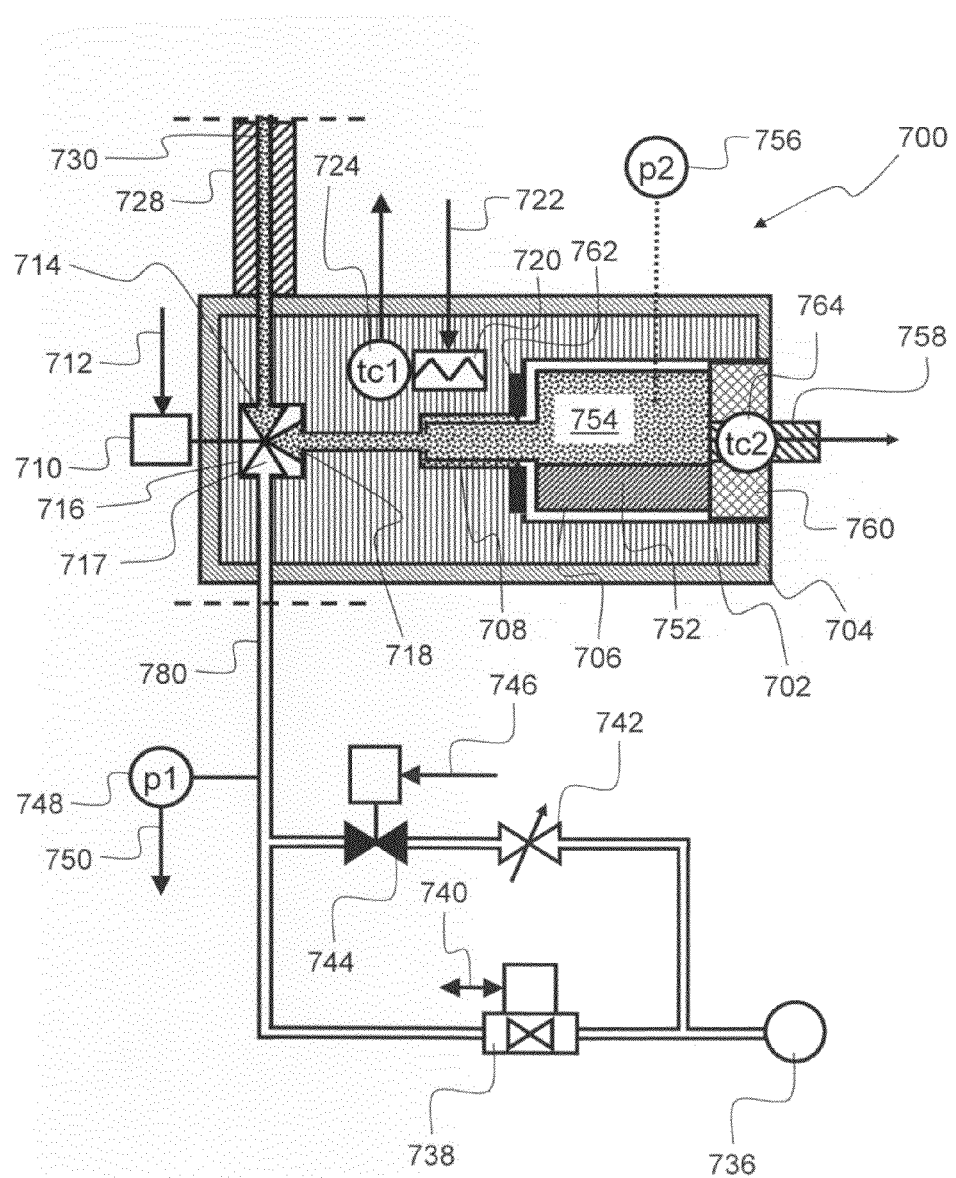
FIG. 7 is a schematic drawing depicting a state of precursor source process instrumentation during a precursor pulse period.

FIG. 7 depicts a schematic view of a single valve heated source 700 during a precursor pulse period. The source 700 comprises a source framework 702, a heater 720, a feedthrough projection 728, a pulsing valve 716 and a precursor cartridge 706. The source framework 702 is covered with a heat insulator layer 704 for reducing heat loss from the heated source 700 to surrounding air. The precursor cartridge 706 is loaded with liquid or solid precursor so that part of the cartridge volume 752 is occupied with the solid or liquid precursor and the rest of the cartridge volume, so-called precursor vapor space, 754 is available for gas phase species. The precursor cartridge 706 has a reservoir, a neck 708 for sealing the cartridge with an o-ring or a radial axis seal 762 to the source framework 702 and a tail projection 758 for handling the cartridge. A detachable heat insulator layer 760 is placed around the tail projection 758 for controlling the amount of heat energy lost from the tail projection 758 to the surrounding air. The temperature of the heater 720 is measured with a heater thermocouple 724 and the temperature of the precursor cartridge 706 is measured with a cartridge thermocouple 764. The heater thermocouple 724 is used for controlling the power 722 fed to the heater. When the temperature of the heater exceeds the programmed maximum temperature limit, power is not fed to the heater 720. The thermoelectric voltage obtained from the thermocouple 764 is converted with an analog/digital (AD) converted into digital value that is used with a PID controller for controlling the amount of power fed to the heater 720 for reaching correct source temperature. The source framework 702 substantially surrounds the precursor cartridge 706. The precursor cartridge is in thermal contact with the source framework. When the source framework is heated to a constant source temperature, the precursor cartridge receives heat energy from the source framework and the temperature of the precursor cartridge reaches the temperature of the source framework. The tail projection area has slightly higher heat conductivity than the heat insulator layer 704. Thus, a small amount of heat energy flows to the tail projection 758 keeping the surface inside the precursor cartridge near the tail projection, for example, 0.1-10° C. cooler, or in some embodiments 1-3° C. cooler, than the rest of the cartridge. The coldest spot within the continuous gas space determines the maximum vapor pressure of present chemical species. Thus, precursor vapor cannot condense on surfaces near the pulsing valve because the said surfaces are warmer than the tail projection wall and the said surfaces stay clean. The operating principle of the heated source 700 is treated with the help of a virtual pressure indicator 756 reflecting the actual gas pressure within the precursor vapor space 754.

The pulsing valve 716 comprises a diaphragm flow seal (not shown), an open valve inlet 717, controlled source inlet 718, an open valve outlet 714 reaching towards a source outlet conduit 730 and an actuator 710. All the pulsing valve parts except the actuator 710 are heated to the same source temperature as the source framework. The actuator 710 can be for example a pneumatic actuator, a hydraulic actuator or a solenoid actuator. The actuator 710 can be located outside of the source framework and a stem conveys mechanical power from the actuator to a valve shutter (not shown). The actuator 710 can be controlled from a control system 712. The actuator is kept in a temperature that is as low as possible, for example, 20-100° C., in some embodiments 20-50° C. to increase the lifetime of the actuator 710. The valve shutter is preferably a normally closed metal diaphragm that controls the flow of gases from the source inlet 718 to the valve outlet 714. Pneumatically activated high-temperature Swagelok® ALD diaphragm valve serves as an example of a pulsing valve 716 suitable for the present heated precursor source.

Nitrogen gas (or inactive gas) flow rate originating from an inactive gas source 736 is modulated with a computer-controlled system. According to one embodiment a mass flow controller 738 is fast enough for setting 740 new mass flow rate for inactive gas, for example, within 0.05-1 s, in some embodiments within 0.05-0.1 s. According to another embodiment a standard thermal mass flow controller 738 is used for setting basic constant mass flow rate for inactive gas and a pulsing valve 744 is used to control 746 adding more inactive gas to a source entrance conduit 780 so that the total mass flow rate of inactive gas arriving at the open valve inlet 717 is modulated between a low value and a high value. The said low value is selected, for example, from a range of 10-500 sccm, in some embodiments 50-100 sccm. The said high value is adjusted, e.g., with a needle valve 742 or a capillary and the said high value is selected, for example, from a range of 100-2000 sccm, in some embodiments 300-500 sccm, so that the high value is higher than the low value. The pressure of the source entrance conduit is measured with a pressure transducer 748 that transmits an analog or digital signal 750 to a data processing system. The said signal is used for helping the adjustment of the inactive gas flow rates to suitable ranges. One of the benefits of the present arrangement is that the relatively expensive components namely the inactive gas mass flow controller 738, the inactive gas pulsing valve 744 and the pressure transducer 748 are in cool area and only in contact with inactive nitrogen gas.

Precursor vapor or mixture of precursor vapor and inactive gas is injected with the help of the flow control valve (or pulsing valve) 716 into the stream of inactive carrier gas that pushes precursor vapor towards the source outlet conduit 730 and the reaction space.

Figure 8:
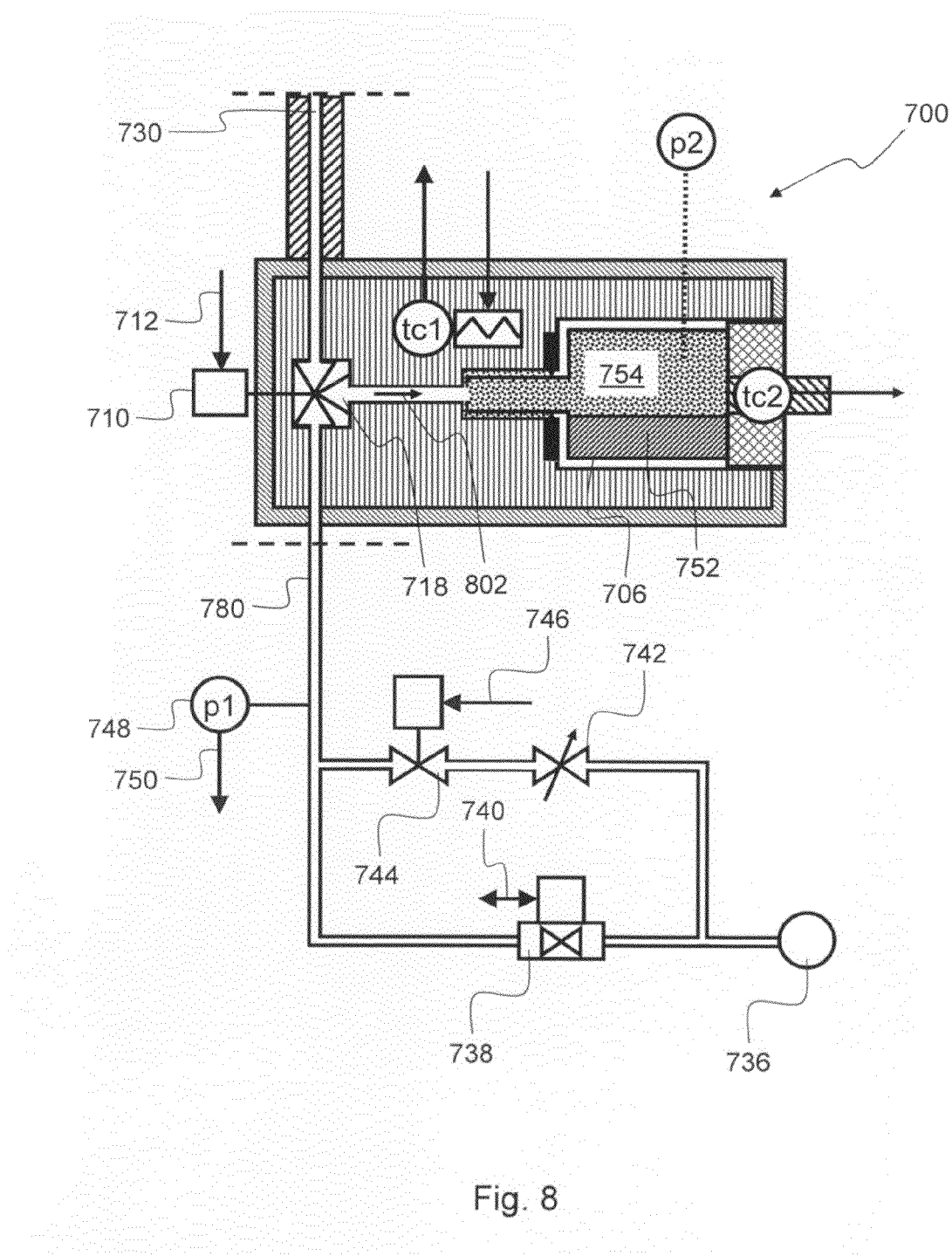
FIG. 8 is a schematic drawing depicting a state of precursor source process instrumentation during a gas charge period.
Figure 9:
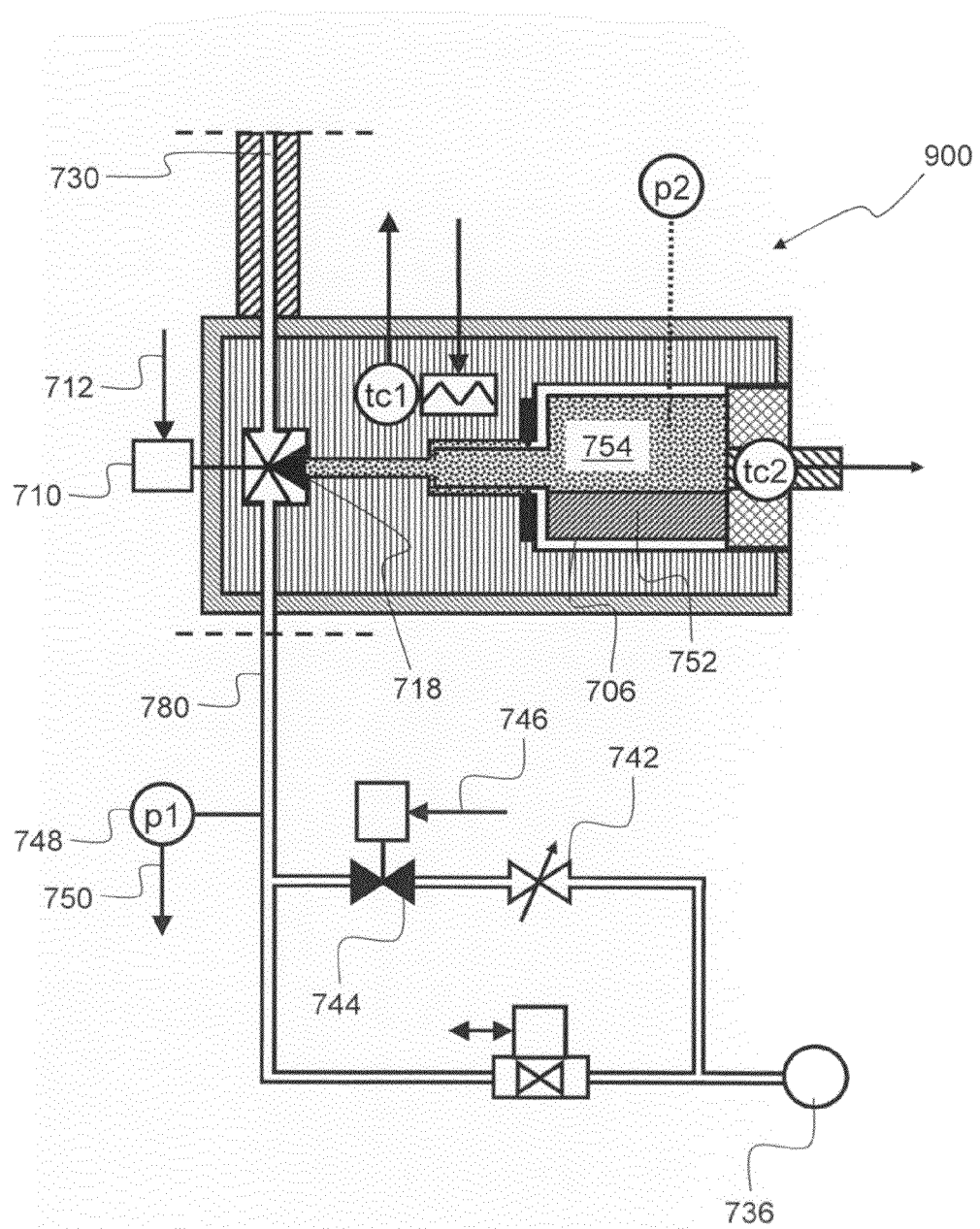
FIG. 9 is a schematic drawing depicting a state of precursor source process instrumentation during a purge period.

FIG. 8 depicts a schematic side view of the single valve heated source 700 during a gas charge period. In certain cases, the vapor pressure of the precursor can be too low for efficiently entering the reactor during a pulse period. In the embodiment shown in FIG. 8, the vapor pressure inside the source is raised during the gas charge period. In this embodiment, inactive gas is conveyed via the valve 716 into the precursor source container/cartridge 706 to raise the pressure. The source inlet 718 of the valve 716 is subsequently closed as shown in FIG. 9 until the commencement of the next precursor pulse. In this closed state the mixture of precursor vapor and inactive gas is not able to flow through the source inlet 718 into the source entrance conduit 780, nor into the source outlet conduit 730. Upon commencement of the next precursor pulse, the valve 716 is opened so that the mixture with raised pressure flows more easily through the source inlet 718 and via the source outlet conduit 730 towards the reactor as depicted in FIG. 7.

Certain rules for the design of the heated precursor source in certain embodiments can be presented as follows: Take benefit of pressure differences because mass transport is faster by forced flow than by diffusion and gases always flow from higher pressure to the direction of lower pressure. Take benefit of temperature differences because thermal energy always moves from higher temperature to lower temperature and coldest spot inside a gas space determines the vapor pressure of chemical species within the gas space. Keep all the possible mechanical moving parts in cool area because mechanical moving parts last longer at low temperatures.

The operation of the heated source presented in FIGS. 7-9 is further illustrated with the description of a deposition process. Aluminum oxide $Al_2O_3$ is grown from heated aluminum chloride $AlCl_3$ (sometimes written as a dimer $Al_2Cl_6$) and vaporized water $H_2O$. $AlCl_3$ pieces are loaded into the cartridge 706 that is placed inside the heated precursor source 700. The heated precursor source is heated to a programmed source temperature to create about 0.05-10 hPa $AlCl_3$ vapor pressure above the solid $AlCl_3$ pieces. For example, when the source temperature is 100° C., the resulting $AlCl_3$ vapor pressure is 1 hPa within the precursor vapor space 754. In some embodiments it is advantageous to evaporate the source chemical at source temperatures as low as possible, while still generating sufficiently big precursor vapor dosage for covering the whole substrate surface, to avoid the decomposition of heat-sensitive precursors within the heated source.

A benefit of evaporating $AlCl_3$ at low source pressure is that low pressure increases the diffusion speed of gas molecules and helps to recover the equilibrium vapor pressure of $AlCl_3$ as fast as possible. In an embodiment $AlCl_3$ evaporates for about 0.5-4.0 s until about 0.05-10 hPa $AlCl_3$ vapor pressure above the solid $AlCl_3$ pieces is obtained. The inactive gas flow going through the source inlet conduit 780 is increased e.g. to 1000 sccm, which increases the pressure of the inactive gas in the source inlet conduit to a pressure value that is above the gas pressure within the precursor gas space 754. Then the source side of the pulsing valve 718 is opened. Inactive gas flows from the source inlet conduit 780 to the precursor gas space, e.g., 0.2-1.0 s until the pressure of the source container 706 is increased with inactive gas to about 5-20 hPa. Inactive gas mixes with source chemical vapor. Then the flow rate of inactive gas is decreased for example from 1000 sccm to 100 sccm to decrease the gas pressure of the inactive gas in the source inlet line 780. Now the flow direction of gases is reversed and the gas mixture flows out of the precursor vapor space 754 of the source container through the pulsing valve 716 into the reactor in-feed line 730. Carrier gas flow, e.g. 100 sccm of nitrogen gas, pushes the inactive gas/precursor vapor mixture into the reaction space (not shown). One of the benefits of the embodiment is that only a single pulsing valve is needed in the heated area of the precursor source.

Within the reaction space, where a substrate is located, $AlCl_3$ molecules chemisorb on the substrate surface until available reactive surface sites, namely OH groups, have been consumed and the surface becomes saturated with a molecular layer of the $AlCl_3$ molecules, or more precisely, with the ClAl< and $Cl_2Al$— fractions of the $AlCl_3$ molecules. Here, "—" denotes a chemical bond between an Al atom and a surface oxygen atom and "<" denotes two chemical bonds between the Al atom and surface oxygen atoms. The original $AlCl_3$ molecule has three chlorine Cl atoms attached to the center Al atom. When the $AlCl_3$ molecule reacts with the surface hydroxyl OH groups, one or two chlorine atoms receive a hydrogen atom and form gaseous hydrogen chloride HCl molecules as a reaction by-product.

The surface is now covered with chlorine atoms. The only way the $AlCl_3$ molecules could adhere to the Cl-covered surface is by physical adsorption (physisorption). However, the substrate temperature is kept above the condensation point of the $AlCl_3$ vapor, so physisorption is not possible and the surplus $AlCl_3$ molecules stay in the gas phase. As a result, only up to a single molecular layer of $AlCl_3$ molecule fractions are able to stay on the substrate surface. When the $AlCl_3$ exposure period ends, the source side of the pulsing valve 718 is closed and mixture of $AlCl_3$ vapor and inactive gas is not any longer injected from the precursor vapor space 754 into the stream of inactive gas flowing through the pulsing valve 716 and the deposition cycle proceeds to a first removal period. When the precursor vapor space 754 has been isolated with the closed pulsing valve from the surrounding gas conduits, the precursor vapor space 754 depleted from $AlCl_3$ vapor during the source chemical pulse starts to recover by $AlCl_3$ evaporating from solid $AlCl_3$ pieces 752. The composition of the gas coming through the reactor in-feed conduit 730 changes rapidly from a mixture of $AlCl_3$ vapor and inactive gas into pure inactive gas. Residual $AlCl_3$ molecules and reaction by-product molecules (HCl) are guided from the reaction space towards the exhaust line by flowing inactive gas.

As to an oxygen source (or more generally, non-metal source) for the deposition process, a reference is made to FIGS. 1-2. During non-metal exposure period, $H_2O$ vapor is injected from the temperature-controlled liquid source 100 (through a three-way valve 104 into the stream of inactive gas and the resulting gas mixture flows through the reactor in-feed conduit 108 as indicated with an arrow 138. The gas flow is guided from the reactor in-feed conduit to the reaction chamber 106 where the substrate 118 is located. The other precursor conduit, i.e. reactor in-feed line for the $AlCl_3$ source, has inactive gas flow towards the reaction chamber 106. Thus, while one precursor conduit is used for pulsing source chemical vapor into the reaction chamber, the other precursor conduit is protected by flowing inactive gas atmosphere.

In the reaction space $H_2O$ molecules chemisorb on the substrate 118 surface, which was saturated with $AlCl_3$ molecule fractions during the preceding precursor exposure, until available reactive surface sites, namely surface Cl atoms, have been consumed and the surface becomes saturated with a molecular layer of the hydroxyl OH groups originating from the $H_2O$ molecules. After that the only way the $H_2O$ molecules could adhere to the surface is by physisorption. However, the substrate temperature is kept above the condensation point of the $H_2O$ vapor, so physisorption is not possible and the surplus $H_2O$ molecules stay in the gas phase. As a result, only up to a single molecular layer of $H_2O$ molecule fractions are able to bind to the substrate surface and form thin film material. When the $H_2O$ exposure time ends, $H_2O$ vapor is not any longer injected into the stream of inactive gas and the deposition cycle proceeds to a second removal period.

During the second removal period, the composition of the gas coming from the reactor in-feed conduit 108 changes rapidly from a mixture of $H_2O$ vapor and inactive gas into pure inactive gas. Residual $H_2O$ molecules and reaction by-product molecules, namely methane $CH_4$ molecules, are guided from the reaction space towards the exhaust line by flowing inactive gas. The substrate surface is now uniformly covered with up to a molecular layer of thin film material, in this case aluminum oxide $Al_2O_3$ with surface OH groups. The substrate is now ready for the next $AlCl_3$ vapor exposure from the heated precursor source 700 that has recovered during the first removal period, the $H_2O$ exposure period and the second removal period. The deposition cycle consisting of the $AlCl_3$ exposure period, the first removal period, the $H_2O$ exposure period and the second removal period is repeated until an $Al_2O_3$ film of desired thickness is obtained. Typical growth rate of $Al_2O_3$ thin film obtained with the present process has been about 0.9 Å/deposition cycle.

Figure 10:
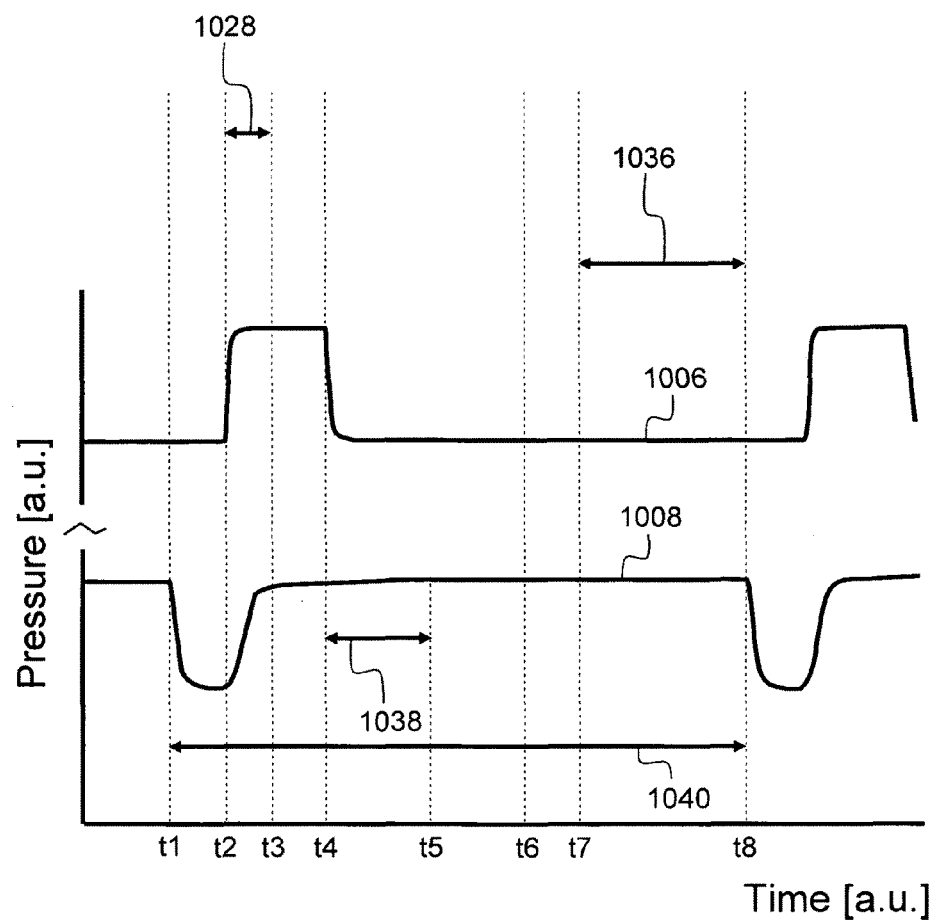
FIG. 10 is a schematic drawing depicting pressures and timing of a precursor source according to one embodiment.

FIG. 10 depicts the pressure 1006 of a first precursor source line and the pressure 1008 of a first precursor source container as a function of time in arbitrary units. In this embodiment relatively high gas pressure is kept within the source container while the vapor pressure of the precursor is recovering to an equilibrium level. A heated precursor source presented in the foregoing is used as the first precursor source. At time t1 pulsing valve 716 (FIG. 7) of the heated source 700 (FIG. 7) is opened and the pressure 1008 of the precursor container gas volume 754 (FIG. 7) decreases. At t2 inactive gas flow rate is increased in the source entrance conduit 780 (FIG. 7) by the mass flow controller 738 (FIG. 7) or the inactive gas pulsing valve 744 (FIG. 7) and gas pressure 1006 quickly increases inside the source entrance conduit 780 as measured with a line pressure transducer 748 (FIG. 7). Part of inactive gas flows into the source container and pressure of the precursor container gas volume increases during the t2-t3 time period 1028 until an equilibrium pressure is reached. At t3 the pulsing valve 716 (FIG. 7) is closed and the source container is isolated from the source line. Purging of the source line continues at high speed. At t4 inactive gas flow rate is decreased to a low level in the source entrance conduit. During the t4-t5 time period 1038 all the pulsing valves of the reactor stay closed and purging of the source conduits and the reaction chamber with inactive gas continues. In this case the precursor cartridge has a lot of evaporation surface and thus at time t5 the vapor pressure of precursor has already reached equilibrium pressure, i.e. maximum attainable vapor pressure at the source temperature, and the heated precursor source is ready for the next precursor pulse. In order to maximize the available precursor vapor dosage, precursor equilibrium pressure is preferably reached before the next pulsing cycle begins at time t8. At time t6 the pulsing valve of the second precursor source is opened and second precursor vapor is injected into the stream of inactive gas within the second precursor source line. At time t7 the pulsing valve of the second precursor source is closed and the flow rate of inactive gas within the second source line is decreased. During the t7-t8 time period 1036 all the pulsing valves of the reactor stay closed and purging of the source conduits and the reaction chamber with inactive gas continues. One pulsing cycle covers the t1-t8 time period 1040. At t8 execution of the following pulsing cycle starts by opening the pulsing valve of the first precursor source in the same way as at time t1.

Figure 11:
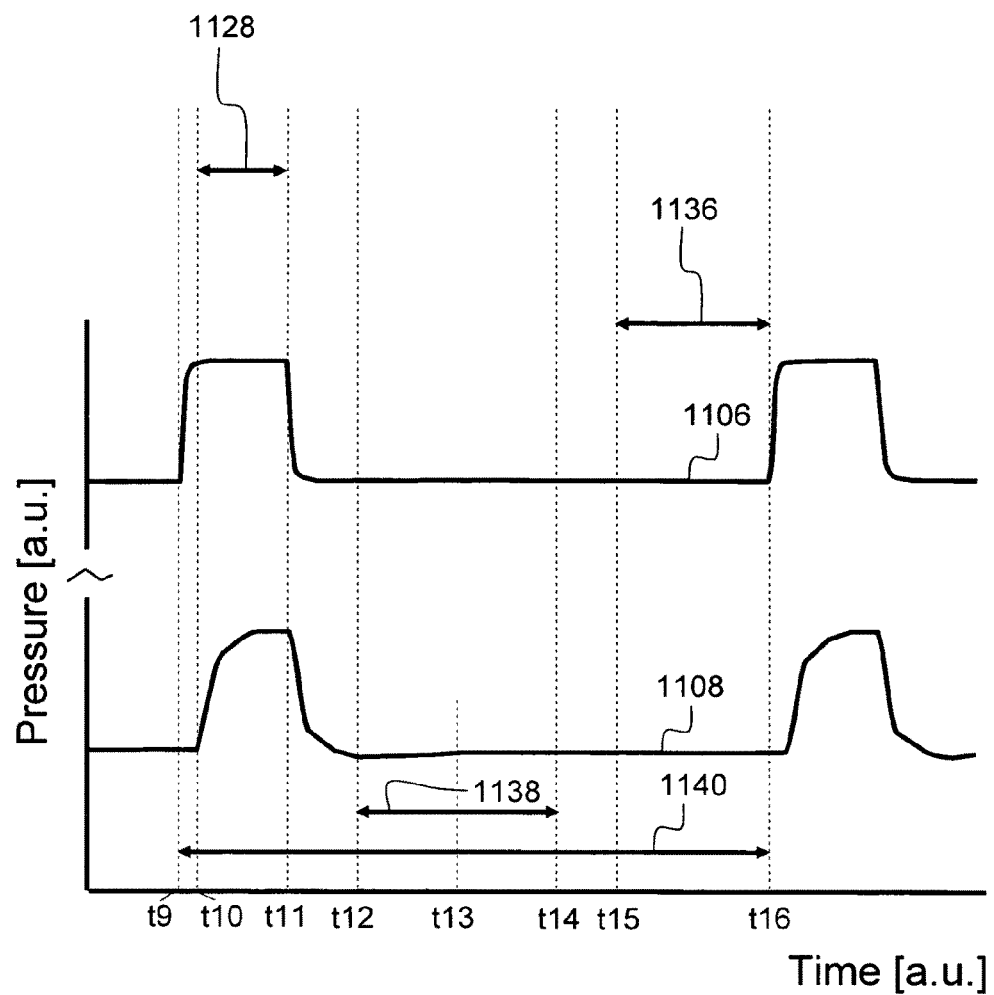
FIG. 11 is a schematic drawing depicting the pressures and timing of a precursor source according to another embodiment.

FIG. 11 depicts pressure 1106 of the first precursor source line and the pressure 1108 of the first precursor source container as a function of time in arbitrary units. In this embodiment relatively low gas pressure is kept within the source container while the vapor pressure of the precursor is recovering to the equilibrium level. The heated precursor source presented in the foregoing is used as the first precursor source. At time t9 inactive gas flow rate is increased in the source entrance conduit 780 (FIG. 7) by the mass flow controller 738 (FIG. 7) or the inactive gas pulsing valve 744 (FIG. 7) and gas pressure 1106 quickly increases inside the source entrance conduit 780 as measured with the line pressure transducer 748 (FIG. 7). At time t10 pulsing valve 716 (FIG. 7) of the heated source 700 (FIG. 7) is opened. Part of inactive gas flows into the source container and pressure 1108 of the precursor container gas volume increases during the t10-t11 time period 1128 until an equilibrium pressure is reached. Pressure variation within the source containers mixes efficiently inactive gas with precursor vapor and as a result usable mixture of inactive gas and precursor vapor at relatively high pressure is obtained. At time t11 inactive gas flow rate is decreased to a low level in the source entrance conduit 780 and the pressure of the source entrance conduit decreases rapidly (curve 1106). Simultaneously the pressure of the source container starts to decrease because the pressure of the source line becomes lower than the pressure of the source container, the pulsing valve is still open and the source container is in fluid communication with the source line. At t12 the pulsing valve 716 (FIG. 7) is closed and the source container is isolated from the source line. The precursor vapor pressure starts to increase and equilibrium precursor vapor pressure level is reached at time t13. Purging of the source line continues. During the t12-t14 time period 1138 all the pulsing valves of the reactor stay closed and purging of the source conduits and the reaction chamber with inactive gas continues. All the residual precursor molecules and volatile reaction byproducts are pushed to the exhaust line of the reactor. In this case the precursor cartridge has a lot of evaporation surface and thus at time t13 the vapor pressure of precursor has already reached equilibrium pressure, i.e. maximum attainable vapor pressure at the source temperature, and the heated precursor source is ready for the next precursor pulse. In order to maximize the available precursor vapor dosage, equilibrium precursor vapor pressure is preferably reached before the next pulsing cycle begins at time t16. At time t14 the pulsing valve of the second precursor source is opened and second precursor vapor is injected into the stream of inactive gas within the second precursor source line. At time t15 the pulsing valve of the second precursor source is closed and the flow rate of inactive gas within the second source line is decreased. During the t15-t16 time period 1136 all the pulsing valves of the reactor stay closed and purging of the source conduits and the reaction chamber with inactive gas continues. All the residual precursor molecules and volatile reaction byproducts are pushed to the exhaust line of the reactor. One pulsing cycle covers the t9-t16 time period 1140. At t16 execution of the following pulsing cycle starts by opening the pulsing valve of the first precursor source in the same way as at time t9.

The description of FIG. 10 suits well for an embodiment in which the vapor pressure of a liquid or solid precursor in itself is too low for efficiently entering the reactor during a pulse period and the evaporation rate of the precursor is slow, whereas the description of FIG. 11 suits well for an embodiment in which the vapor pressure of the precursor in itself is too low for efficiently entering the reactor during a pulse period and the evaporation rate of the precursor is sufficiently rapid for fast recovery of the precursor vapor pressure. Description of FIG. 10 and FIG. 11 utilizes an additional pressure raise with the aid of conveying inactive gas into the precursor container and conveying gas mixture comprising inactive gas and precursor vapor out of the precursor container in a timed way.

Figure 12:
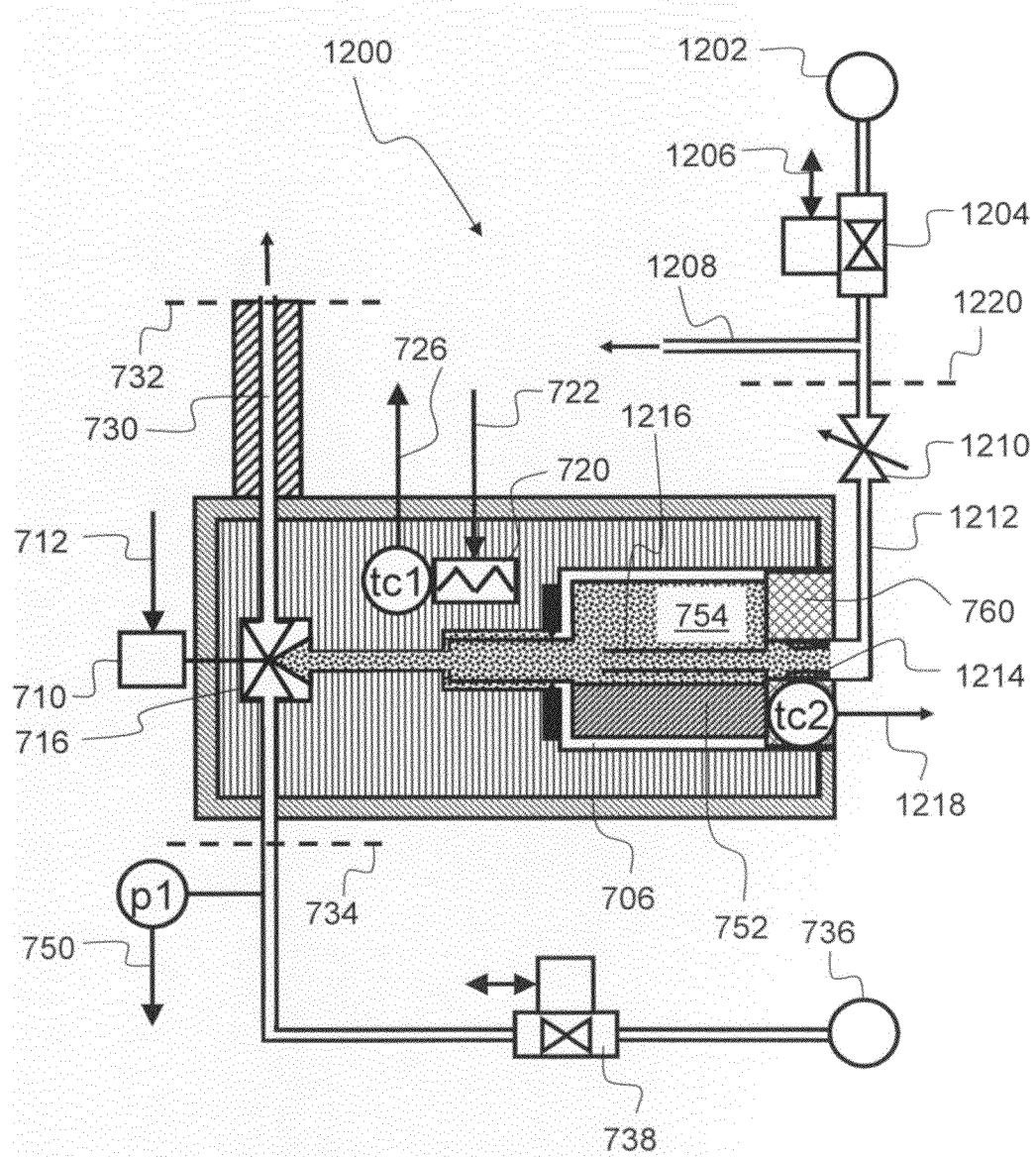
FIG. 12 is a schematic drawing depicting a heated precursor source comprising inactive gas in-feed system.

FIG. 12 depicts a schematic view of a heated precursor source 1200 having a forced primary carrier gas flow coming from the precursor loading side of the source. Primary carrier gas flow is arranged with a primary inactive gas source 1202, inactive gas mass flow controller 1204 having I/O interface 1206 for receiving setting values for the mass flow controller and sending mass flow readings, needle valve 1210 serving as a manually adjustable flow restrictor, primary entrance conduit 1212, sublimate collector conduit 1214 and cartridge entrance conduit 1216. Secondary carrier and purge gas flow is arranged with a secondary inactive gas source 736 that can be a separate gas source or the same as the primary inactive gas source 1202, and an inactive gas mass flow controller 738. Primary carrier gas flow mixes with precursor vapor in the gas space 754 within the precursor cartridge 706 and the mixture is portioned out with the source pulsing valve 710. Cartridge entrance conduit 1216 lengthens the path for molecular diffusion and decreases the amount of precursor vapor diffusing upwards the primary carrier gas line to the area of the sublimate collector conduit 1214. The inner diameter of the cartridge entrance conduit 1216 can be, for example, about 1-20 mm, in some embodiments 4-8 mm and the length of the cartridge entrance conduit can be, for example, 10-100 mm, in some embodiments 30-50 mm. Tip of the cartridge entrance conduit may have a cup (not shown) for guiding the inactive gas flow towards the solid or liquid precursor 752.

According to one embodiment the mass flow controller 1204 is a thermal type controller that has relative long setting time. Because ALD processes utilize short pulses typically in the order of 0.1-1 s, it is advantageous to arrange a by-pass line 1208 for the primary carrier gas flow. The by-pass line 1208 lets the inactive gas flow through the mass flow controller 1204 all the time including the purge time of the deposition when the pulsing valve 716 is closed. The by-pass line 1208 decreases flow rate fluctuations. According to another embodiment the mass flow controller is a pressure-based controller that is fast enough to respond to the pressure fluctuations generated by the pulsing valve 716.

The temperature of the precursor cartridge 706 is measured with a second source thermocouple 1218. The temperature reading is used for adjusting the amount of heating power fed 722 to the heater 720 of the precursor source. The second source thermocouple 1218 is in thermal contact with the heated volume of the precursor source.

The precursor source 1200 is preferably removable. Opening an outlet connection 732, primary carrier gas line connection 1220 and secondary carrier and purge gas line connection 734 makes it possible to detach the precursor source from the deposition reactor (not shown). The precursor cartridge 706 is heated to source temperature, in some embodiments selected from the range between +40 and +200° C. The pulsing valve 716 is kept closed. Inactive gas flows from the inactive gas source 1202 through the mass flow controller 1204 to the by-pass conduit 1208. The inactive gas flow keeps the gas space 754 of the source cartridge 706 pressurized to a selected pressure value, in some embodiments to 5-30 mbar, because the gas space 754 is in static fluid communication with inactive gas source through the primary entrance conduit 1212 and needle valve 1210. Precursor chemical 752 vaporizes to the gas phase 754 of the precursor cartridge until a characteristic vapor pressure of the precursor chemical is reached. Some of the precursor molecules in the gas space 754 diffuse through the cartridge entrance conduit 1216 to the sublimate collector conduit 1214 where the precursor molecules condense to the inner surfaces of the sublimate collector conduit 1214. The temperature of the sublimate collector conduit 1214 is lower than the temperature of the gas space 754 of the precursor cartridge 706. The characteristic vapor pressure of a chemical depends on the temperature of the chemical vapor. When the temperature of the surface of the sublimate collector conduit 1214 is low enough, the characteristic vapor pressure of a chemical becomes negligible near the surface and the precursor molecules cannot diffuse upstream to the primary entrance conduit 1212. During the heating, use and cooling of the precursor source 1200 the temperature of the surface of the sublimate collector conduit 1214 is preferably above room temperature and preferably below the source temperature measured with the second source thermocouple 1218. When the pulse time starts the pulsing valve 716 is opened and when the pulse time ends the pulsing valve 716 is closed. During the pulse time the gas space 754 of the precursor cartridge is in fluid communication with the source outlet conduit 730 through the opened pulsing valve and precursor vapor is pushed with the help of the primary inactive gas flow from the precursor cartridge towards the reaction space housing the substrate (not shown).

Figure 13:
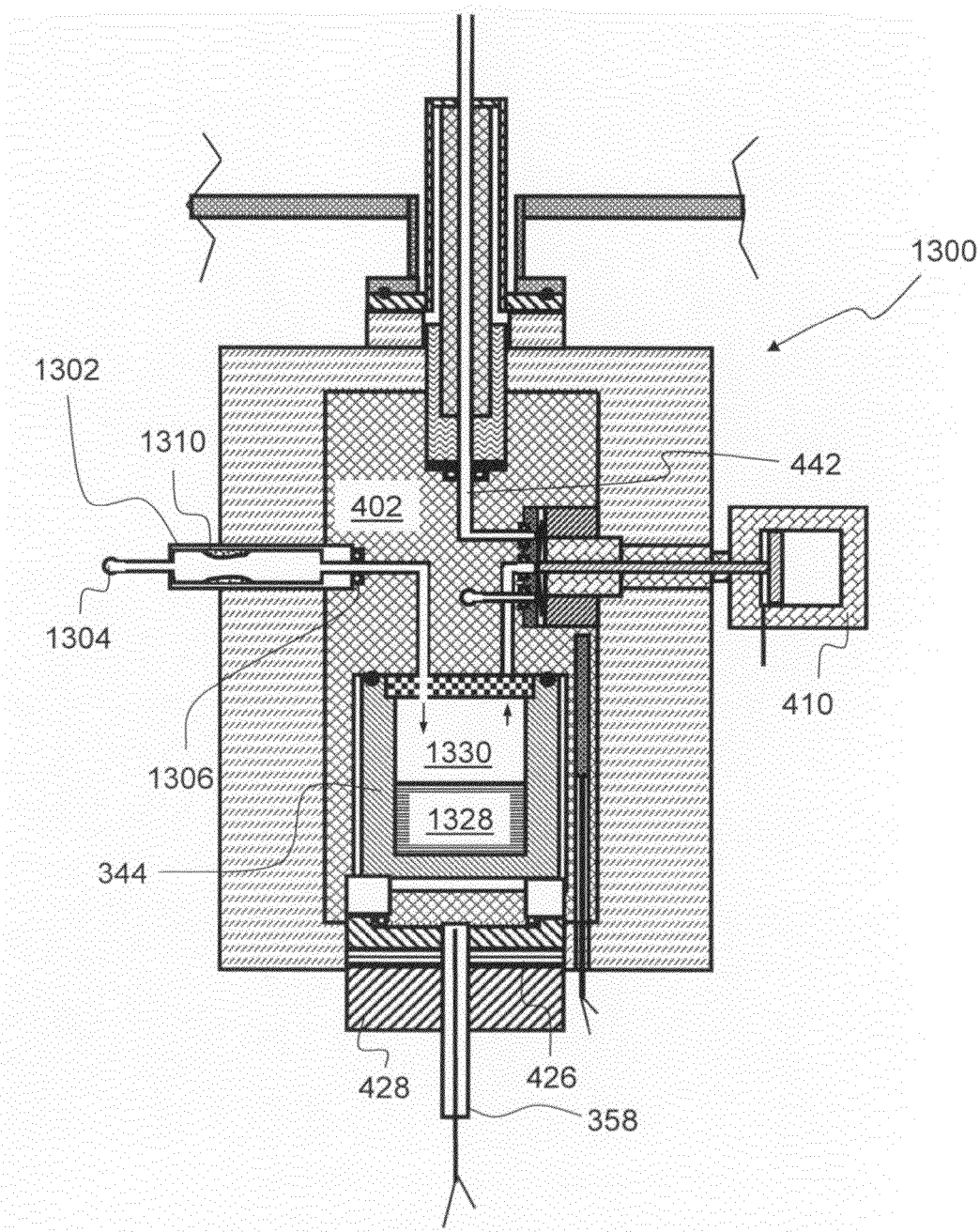
FIG. 13 is a schematic drawing of a heated precursor source comprising valve less inactive gas in-feed system.

FIG. 13 depicts a schematic view of a heated precursor source 1300 that has a single pulsing valve 410 and a sublimate collector conduit 1302 separated from the precursor cartridge 344. The sublimate collector conduit 1302 is fitted with a seal 1306 to the source body 402. First the pulsing valve 310 is kept closed. Liquid or solid precursor 1328 is heated to source temperature, for example, to a temperature selected from the range between +40 and +200° C. Precursor 1328 vaporizes and increases the pressure of the gas space 1330 of the precursor cartridge 344 until characteristic vapor pressure of the precursor is reached. During the pulse time the pulsing valve 410 is open. Inactive carrier gas flows from external inactive gas source 1304 through the sublimate collector space into the gas space 1330 of the precursor cartridge where the inactive carrier gas mixes with precursor vapor. The resulting mixture flows through the pulsing valve 410 to the source outlet conduit 442 and further to the reaction space that houses the substrate (not shown). During the purge time the pulsing valve 410 is closed and precursor vapor stops flowing through the precursor source. Some precursor molecules diffuse through the gas space 1330 to the sublimate collector conduit 1302 kept at lower temperature than the precursor cartridge 344 and form a condensate 1310 on the inner surfaces of the sublimate collector conduit.

Figure 14:
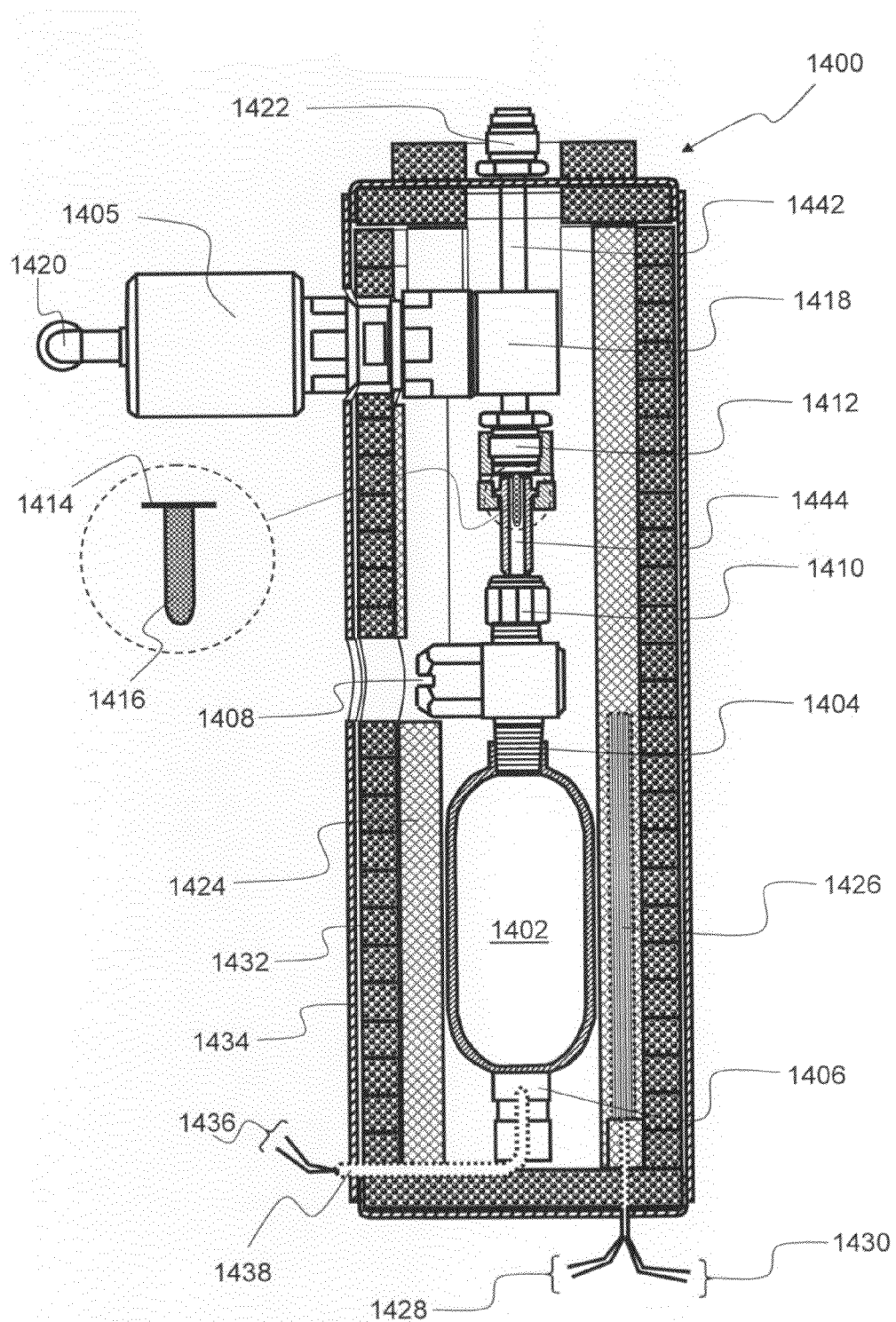
FIG. 14 is a schematic drawing depicting a heated precursor source comprising a removable precursor container according to one embodiment.

FIG. 14 depicts a heated precursor source 1400 comprising a precursor cartridge 1402 that can be sealed with a manual cartridge valve 1408 and detached from the heated precursor source by opening a fitting 1412. The precursor source 1400 comprises a second fitting 1422 for attaching and detaching the precursor source 1400 to and from the deposition reactor device. A three-way pulsing valve 1405 comprising a valve body 1418 is controlled pneumatically. For that purpose the pulsing valve may contain a connection 1420 for receiving compressed air. The precursor source comprises a thermally conductive source body 1424, a heater cartridge 1426 with a power supply 1428 and temperature measurement 1430 with the aid of a thermocouple, a heat insulator layer 1432 and a cover 1434. Near the bottom of the precursor cartridge 1402, the precursor source further comprises a thermally conductive protrusion 1406 having a machined channel for housing a bent thermocouple 1438 with a connection 1436 to a computer-controlled system (not shown).

The precursor source 1400 may have in between flanges of the fitting 1412 a seal 1414 having a particle filter (or gasket filter) 1416 made of metal or ceramic material and pointing down towards the cartridge valve 1408. The particle filter 1416 prevents solid precursor particles to enter the pulsing valve 1418 and reactor in-feed lines any further. Precursor particles that travel upwards are stopped on an outer surface of the particle filter 1416 and are dropped back to the precursor cartridge 1402.

A method of purging the source line before replacing the precursor cartridge 1402 is described hereinafter. Manual cartridge valve 1408 is closed. The heated precursor source is heated to a sufficiently high temperature to generate precursor vapor pressure from any solid or liquid precursor residue on the walls of the conduits. The pulsing valve 1405 is opened. The flow rate of inactive gas through the three-way pulsing valve 1405 to the source outlet conduit 1442 is modulated between high value, e.g., 1000 sccm and low value, e.g., 100 sccm. High flow rate increases the pressure of the inactive gas at the three-way pulsing valve 1405 and low flow rate decreasing the pressure of the inactive gas at the three-way pulsing valve 1405 creating a gas pumping effect. Variable gas pressure empties dead ends and gas pockets efficiently from any gaseous residual precursor. The temperature should be high enough to vaporize solid or liquid precursor residues. Source temperatures capable of generating at least about 0.1 hPa precursor vapor pressure can be generally used for enhancing the purging speed. In an embodiment, the reaction space is heated to a temperature at least as high as the precursor source to prevent the condensation of the precursor vapor on the surfaces of the reaction space.

The intermediate conduit 1444 and source outlet conduit 1442 are pressurized with inactive gas for example from 5 hPa to 20 hPa for 1 minute and then evacuated from 20 hPa back to 5 hPa for 1 minute. The pressurization and evacuation cycle is repeated a number of times, for example, at least 5 times, in some embodiments at least 10 times, to remove residual precursor from the conduits.

The precursor source 1400 may also comprise a third fitting 1410 which can be closed by a chemical manufacturer after filling the cartridge with precursor material. The precursor source 1400 may also comprise a fourth fitting 1404 which can be opened for cleaning the cartridge.

Figure 15:
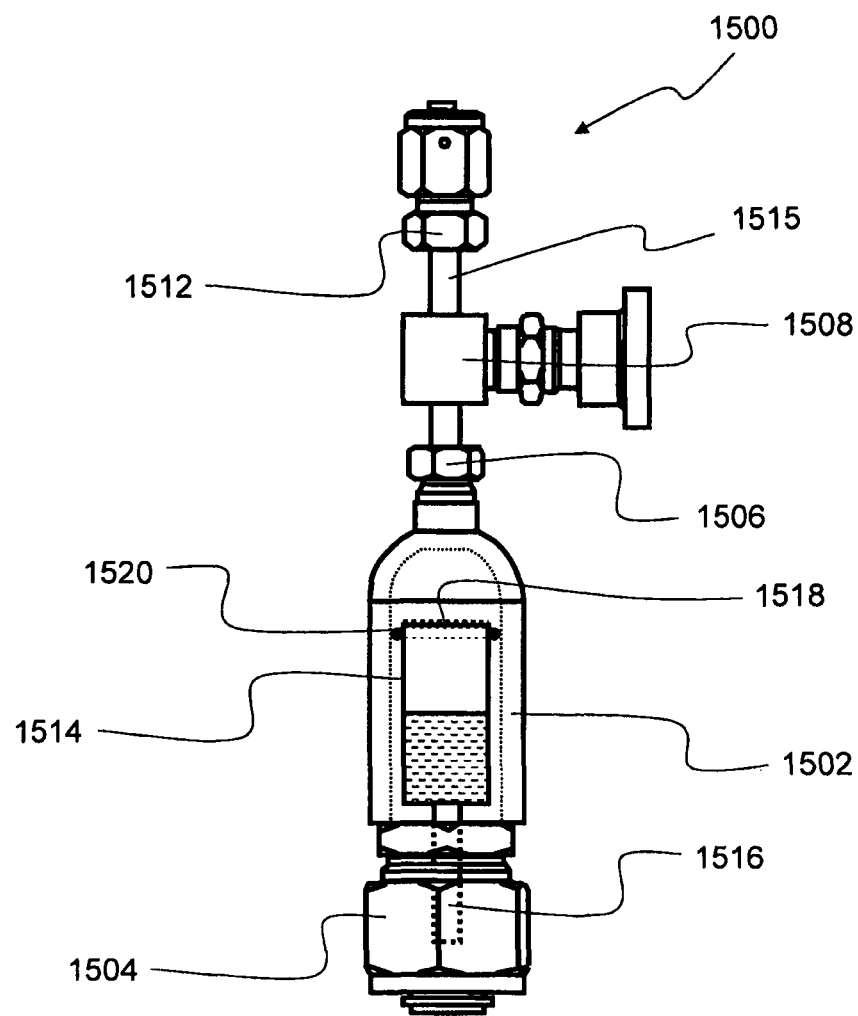
FIG. 15 is a schematic drawing depicting a removable precursor container for a heated precursor source according to another embodiment.

FIG. 15 depicts a removable precursor container 1500 for a heated precursor source according to another embodiment. The container 1500 comprises a precursor chamber 1502, a precursor reservoir 1514 for holding the precursor, a fitting 1504 for loading and unloading the precursor reservoir 1514 and a valve 1508 for isolating the gas space of the precursor chamber from source outlet conduit 1515. The precursor chamber 1502 has an optional neck fitting 1506 for disassembling the precursor container 1500 for cleaning. The precursor reservoir 1514 wall is preferably sealed with a seal 1520 against the precursor chamber 1502 wall for keeping the precursor vapor away from the fitting 1504 area. The precursor reservoir 1514 optionally comprises a handle 1516 for pulling the reservoir out of the precursor chamber 1502 after opening the fitting 1504 and a filter 1518 for keeping solid precursor or powder particles from exiting the precursor reservoir. The precursor container 1500 can be attached to or detached from other parts of the precursor source by the fitting 1512.

Figure 16:
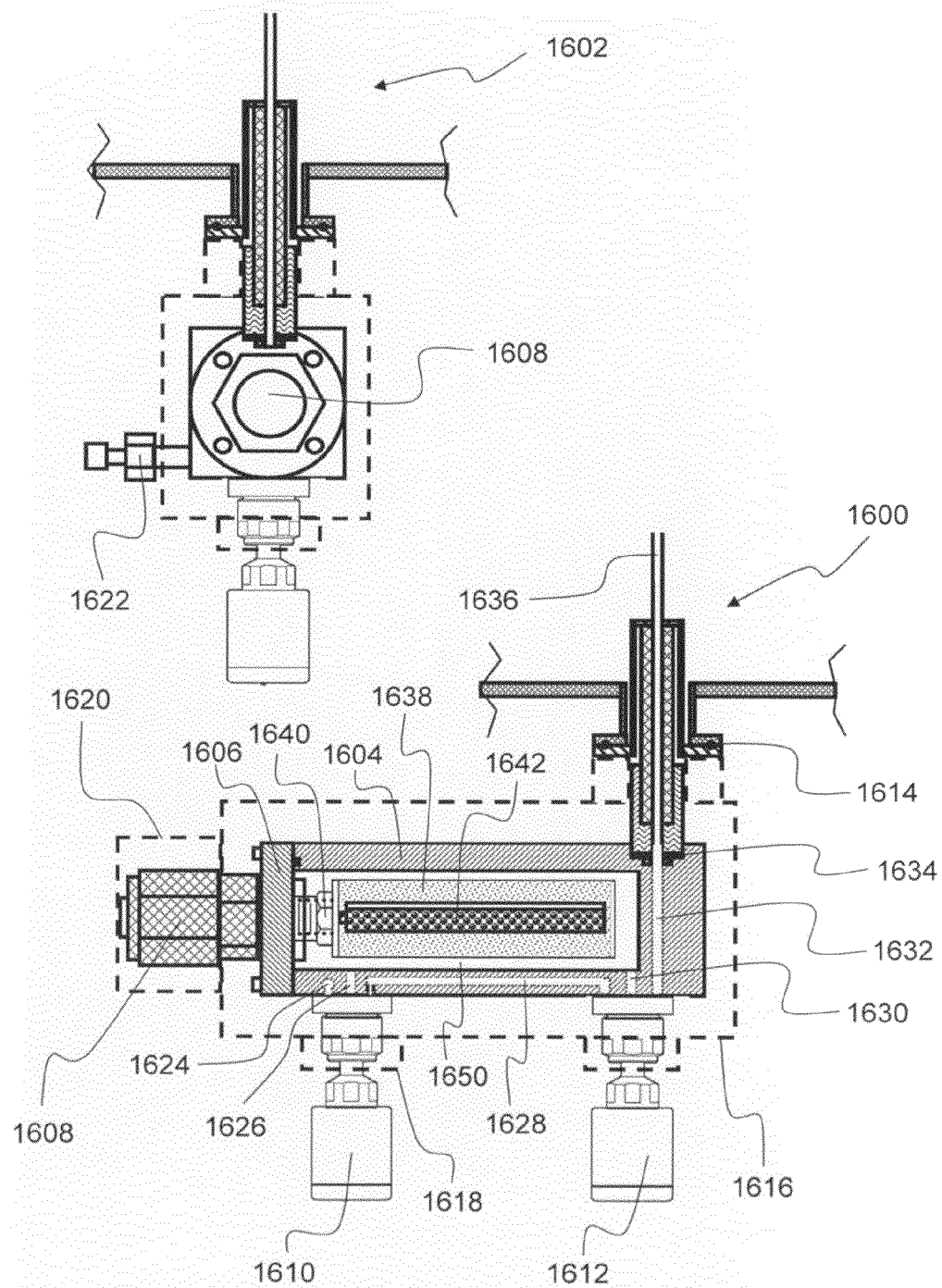
FIG. 16 is a schematic drawing depicting a heated precursor source according to another embodiment.

FIG. 16 depicts a heated precursor source according to another embodiment. The heated precursor source shown from the side 1600 and from the front 1602 comprises a source body 1604, a sealable front flange 1606, a loading port 1608, a inactive gas inlet valve 1610, a precursor vapor outlet valve 1612, a mounting flange 1614, heat insulation of the source body 1616, heat insulation of the pulsing valves 1618 and heat insulation of the loading port 1620. Inactive carrier and purge gas (e.g. nitrogen or argon) arrives to the heated source through a gas inlet connection 1622. When the inactive gas inlet valve 1610 and the precursor vapor outlet valve 1612 are closed, inactive gas flows through the inlet conduit 1624, through the source by-pass conduit 1628 and further through the source outlet conduit 1632 and through the reactor in-feed conduit 1636 to the reaction space (not shown). When the inactive gas inlet valve 1610 and the precursor vapor outlet valve 1612 are open, inactive/carrier gas flow is divided into two parts. The first part of the gas flow goes through the by-pass line 1628. The second part of the gas flow enters a vapor space 1650 of the heated source through the vapor space inlet conduit 1626. The second part of the gas flow is mixed with precursor vapor within the vapor space 1650 of the heated source. The resulting first gas/vapor mixture exits the vapor space through the vapor space outlet conduit 1630. The first gas/vapor mixture is added to the first part of the gas flow coming from the source by-pass conduit 1628 forming a second gas/vapor mixture. The second gas/vapor mixture flows through the source outlet conduit 1632 and through the reactor in-feed conduit 1636 to the reaction space (not shown). A horizontal precursor boat 1642 is loaded into a sinter cartridge 1638. The precursor boat 1642 is in some embodiments made of inert material comprising stainless steel, nickel, titanium, quartz glass, SiC or $Al_2O_3$. The sinter cartridge 1638 is attached with a fitting 1640 to the sealable front flange 1606.

Figure 17:
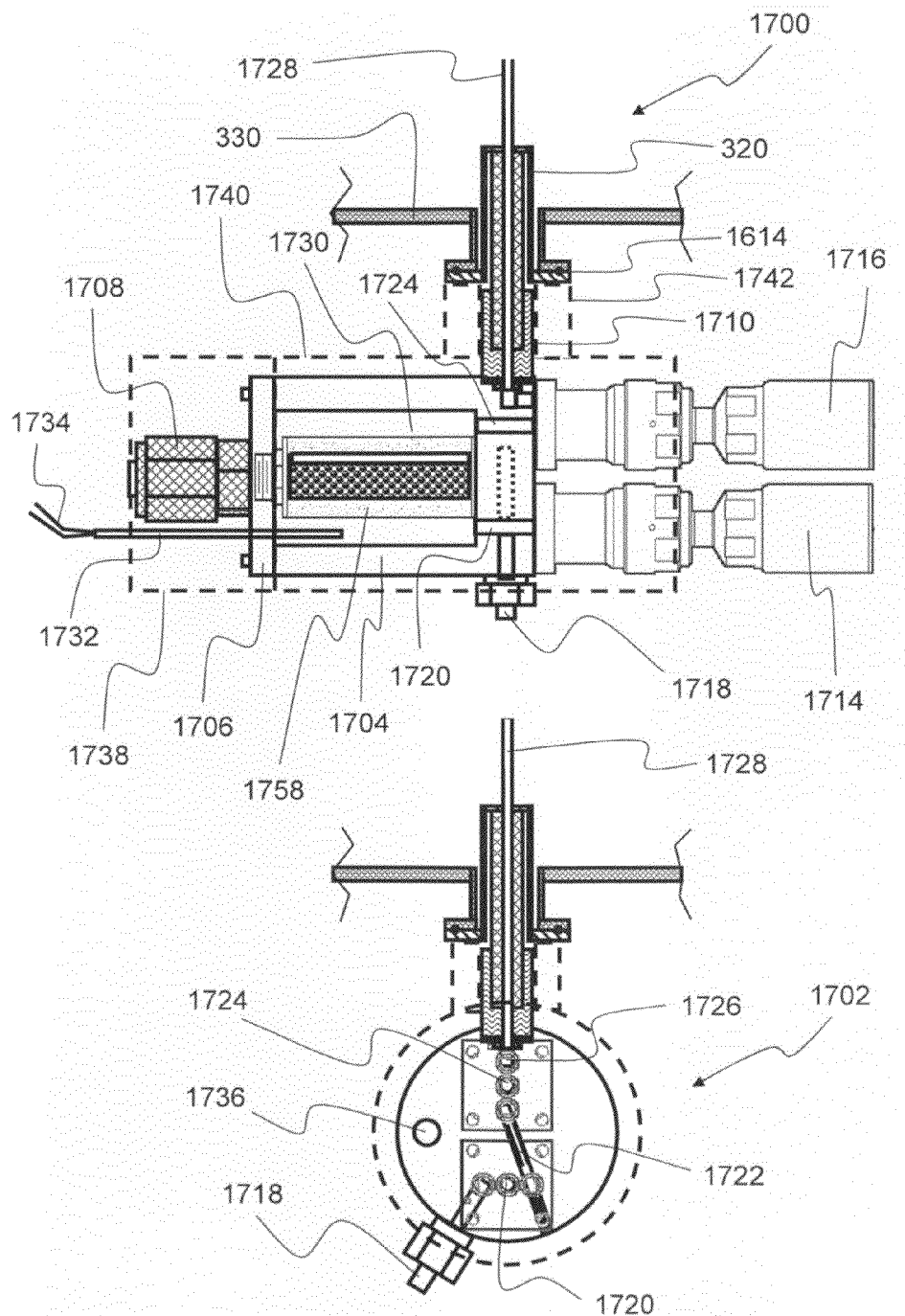
FIG. 17 is a schematic drawing depicting a heated precursor source according to another embodiment.

FIG. 17 depicts a heated precursor source according to another embodiment. The heated precursor source shown from the side 1700 and from the front 1702 comprises a source body 1704, a sealable front flange 1706, a loading port 1708, an inactive gas inlet valve 1714, a precursor vapor outlet valve 1716, a mounting flange 1614, heat insulation of the source body and pulsing valves 1740, heat insulation of the loading port 1738 and heat insulation of the in-feed line 1742. The heat insulation of the source body and pulsing valves 1740 can alternatively be implemented as separate insulations: one for the source body and one for the pulsing valves.

The heated precursor source 1700, 1702 brings certain benefits. The pulsing valves 1714, 1716 are attached to the back side of the source body 1704 in horizontal direction. The loading port 1708 of the source is towards the front side of the reactor and towards the operator of the heated source. The loading and unloading of the precursor cartridge 1758 is straightforward.

The temperature of the heated source is measured with a thermocouple 1732 connected with wires 1734 to a control unit (not shown). A heating cartridge 1736 comprises a heating element and a thermocouple for measuring the local temperature of the heating cartridge. When the inactive gas inlet valve 1714 and the precursor vapor outlet valve 1716 are closed inactive purge/carrier gas (e.g. nitrogen or argon) flows through the following conduits: source inlet connection 1718, the inactive gas inlet valve 1714, the source by-pass line having a flow restrictor 1722, the precursor vapor outlet valve 1716, source outlet conduit 1726, and reactor in-feed conduit 1728.

When the inactive gas inlet valve 1714 and the precursor vapor outlet valve 1716 are open, inactive/carrier gas flow is divided into two parts. The first part of the gas flow goes through the by-pass line having the flow restrictor 1722. The second part of the gas flow enters a vapor space 1730 of the heated source through the vapor space inlet conduit 1720. The second part of the gas flow is mixed with precursor vapor within the vapor space 1730 of the heated source. The resulting first gas/vapor mixture exits the vapor space through the vapor space outlet conduit 1724. The first gas/vapor mixture is added to the first part of the gas flow coming from the by-pass line forming a second gas/vapor mixture. The second gas/vapor mixture flows through the source outlet conduit 1726 and through the reactor in-feed conduit 1728 to the reaction space (not shown).

The heated precursor system utilizes thermal energy leaking from the direction of the reaction chamber heater along the in-feed conduit 1728 towards the heated source body 1704. Heat losses from the internal neck 320 to the surroundings are minimized with the thermal insulation of the neck 1742.

The heated precursor source 1700 is removed from the reactor for service by opening the source inlet connection 1718 and the feed-through fitting 1710.

Figure 18:
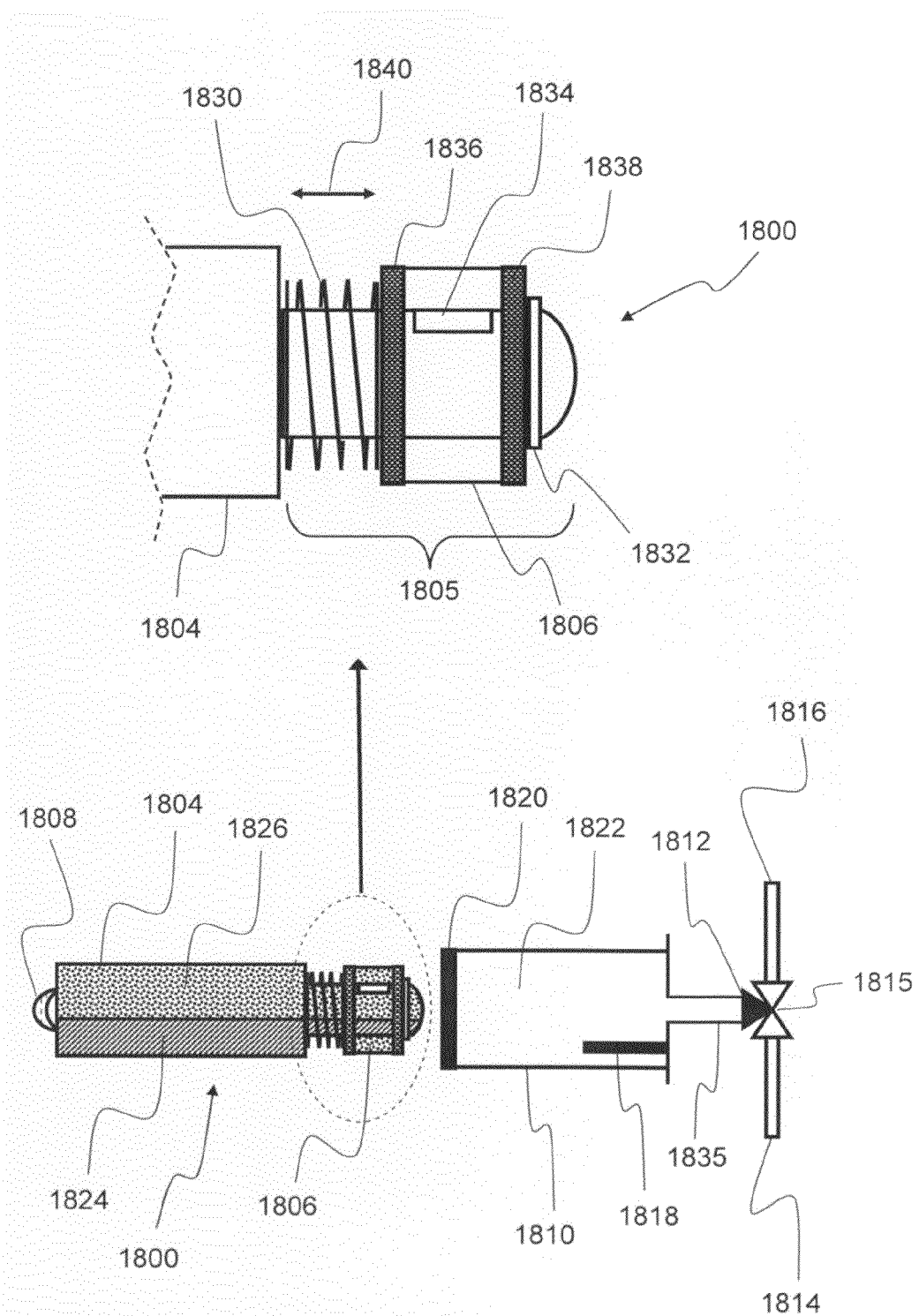
FIG. 18 is a schematic drawing depicting a sealable precursor cartridge according to one embodiment.

FIG. 18 depicts a sealable precursor cartridge according to one embodiment. The precursor cartridge 1800 (whose neck area magnification is shown in the top part of FIG. 18) comprises a cartridge body 1804, the cartridge neck 1805 having an cartridge opening 1834, a slide sleeve 1806 sealed with dynamic seals 1836, 1838 (e.g., radial shaft seals) against the cartridge neck 1805, a return spring 1830, a stopper bulge 1832 and an optional handle 1808. The precursor cartridge is filled with solid or liquid precursor chemical 1824. Precursor vaporizes to a gas space of the cartridge 1826 until equilibrium vapor pressure characteristic of the precursor and the source temperature is reached. A cartridge furnace 1810 comprises a furnace cylinder 1822 sealable with a static seal 1820 (e.g., o-ring or a radial shaft seal) against the cartridge body 1804 and a sleeve pusher 1818. A three-way pulsing valve 1815 is attached to a conduit 1835 leading to the cartridge furnace 1810. The pulsing valve 1815 has a precursor source inlet 1812, an inlet 1814 for inactive gas, and an outlet 1816 towards the reaction space (not shown).

Figure 19:
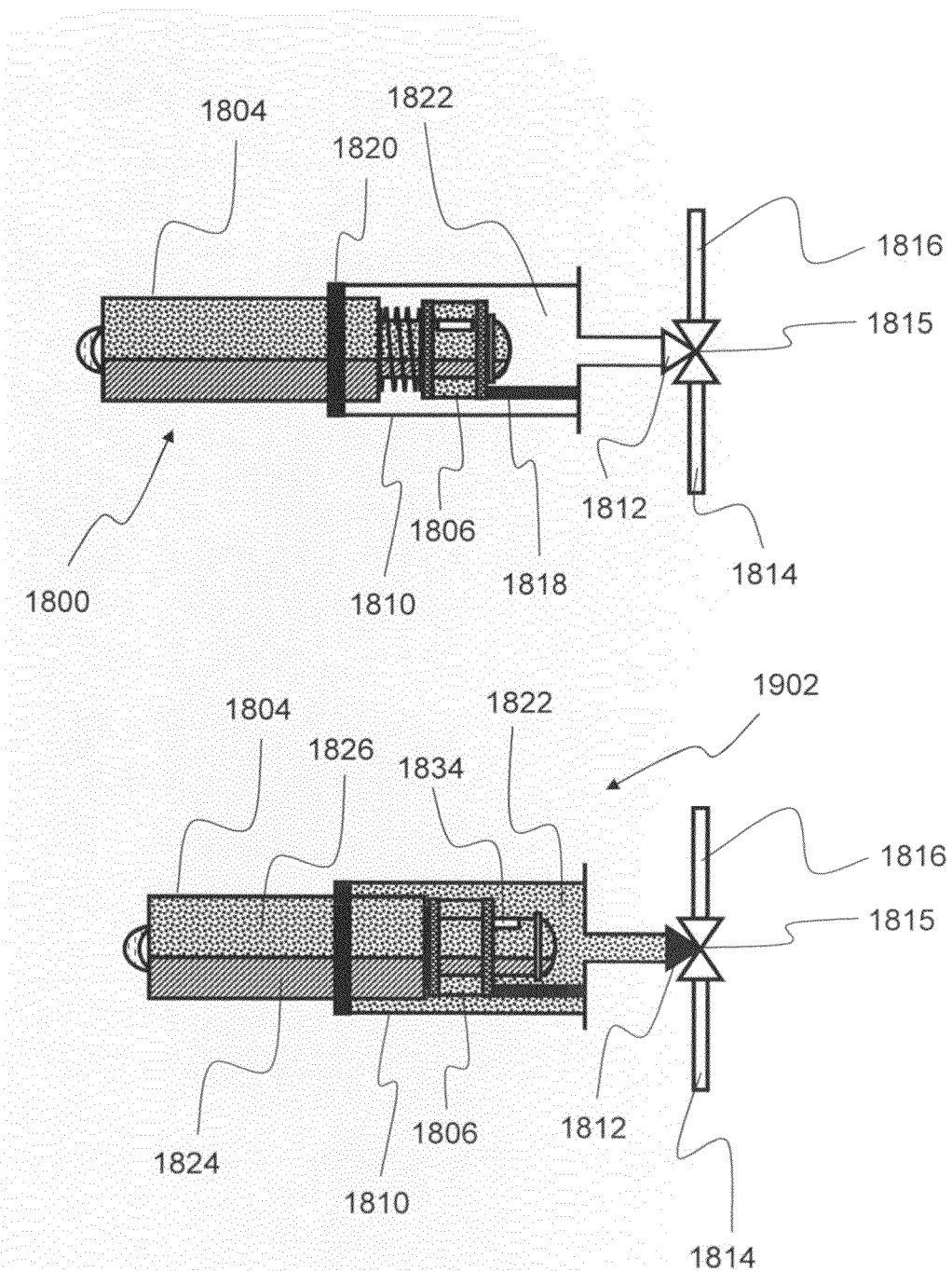
FIG. 19 is a schematic drawing depicting the use of a sealable precursor cartridge according to one embodiment.

FIG. 19 depicts the use of a sealable precursor cartridge. First the source system is purged with inactive gas as illustrated in the top part of FIG. 19. The precursor cartridge 1804 is pushed into the furnace cylinder 1810 until the furnace static seal 1820 forms a seal against the cartridge body 1804 isolating a gas space of the cartridge furnace from the surrounding gas atmosphere (e.g., room air). Inactive gas flows through the source line from the purge inlet 1814 of the pulsing valve 1815 to the outlet 1816 of the pulsing valve. When the pulsing valve precursor source inlet 1812 is opened the gas space inside the furnace cylinder 1822 becomes in fluid communication with the source line 1814, 1816. Inactive gas pressure of the source line is varied with a mass flow controller (not shown). Low inactive gas flow rate (e.g., 100 sccm) drops the pressure of the source line to a low value (e.g., 4 hPa). Low flow rate is kept for a length of time, for example, about 1 minute. High inactive gas flow rate (e.g., 1000 sccm) increases the pressure of the source line to a high value (e.g., 15 hPa). High flow rate is kept for a length of time, for example, about 1 minute. The pressure fluctuation is repeated a number of times, for example, at least 10 times. The pressure fluctuation pumps residual air away from the gas space of the cartridge furnace 1810 and leaves only pure inactive gas to the gas space inside the furnace cylinder 1822. After purging the pulsing valve inlet 1812 is closed.

Next the precursor cartridge is pushed inwards until the cartridge opening 1834 at the cartridge neck is exposed and the vapor space 1826 of the precursor cartridge becomes in fluid communication with the gas space of the cartridge cylinder 1822. When the precursor cartridge 1804 is heated to the source temperature, some of the liquid or solid precursor 1824 vaporizes to the gas space 1826 of the cartridge furnace until the gas space is saturated with the precursor vapor. When the pulsing valve precursor source inlet 1812 is opened, precursor vapor flows through the pulsing valve 1815 to the outlet of the pulsing valve 1816. Carrier gas flowing through the three-way valve from the purge inlet 1814 of the pulsing valve to the outlet 1816 of the pulsing valve pushes the precursor vapor towards the reaction chamber (not shown). When the pulsing valve inlet 1812 is closed, the gas space 1826 of the precursor cartridge depleted from the precursor vapor receives new precursor vapor from the vaporizing liquid or solid precursor 1824 until the gas space again becomes saturated with the precursor vapor and the precursor source is ready for delivering the next precursor pulse.

When it is time to remove the used precursor cartridge 1800 from the heated source or replace it with a new precursor cartridge, the precursor cartridge is kept at source temperature and the cartridge is pulled out of the cartridge furnace 1810 until the return spring 1830 is capable of pushing the slide sleeve 1806 over the cartridge opening 1834 isolating the vapor space of the precursor cartridge 1826 from the gas space of the cartridge furnace 1810. The furnace static seal 1820 still touching the surface of the precursor cartridge 1800 keeps the gas space of the cartridge furnace 1810 isolated from room air. The inlet side of the pulsing valve 1815 is opened and the gas space of the cartridge furnace 1810 is purged with inactive gas that has fluctuating pressure. After all of the residual precursor has been removed from the gas space inside the cartridge cylinder 1822 by purging, the inlet side 1812 of the pulsing valve is closed. The precursor cartridge 1800 is then removed from the cartridge furnace 1810 and a new precursor cartridge is placed to cartridge furnace.

Figure 20:
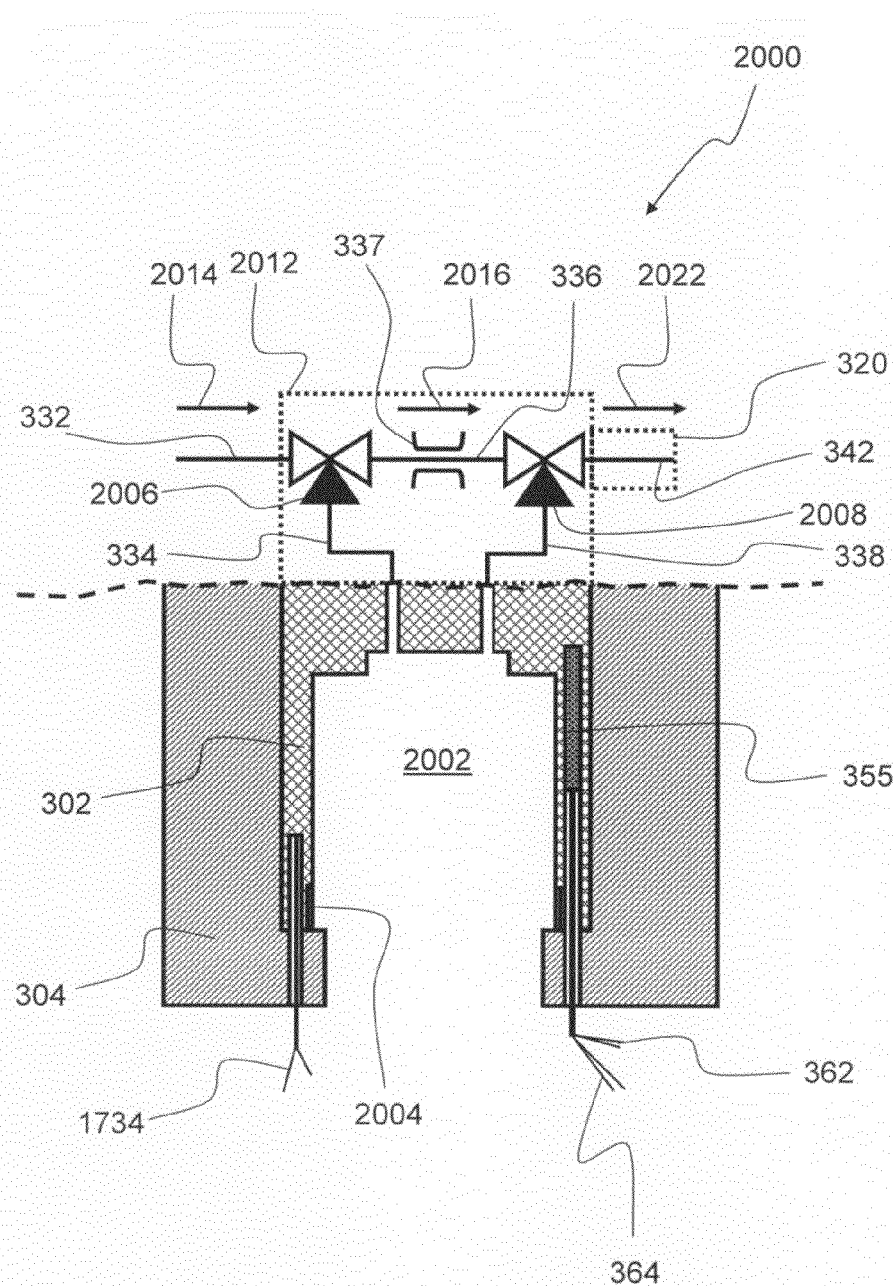
FIG. 20 is a schematic drawing depicting a heated source suitable for a sealable precursor cartridge.
Figure 21:
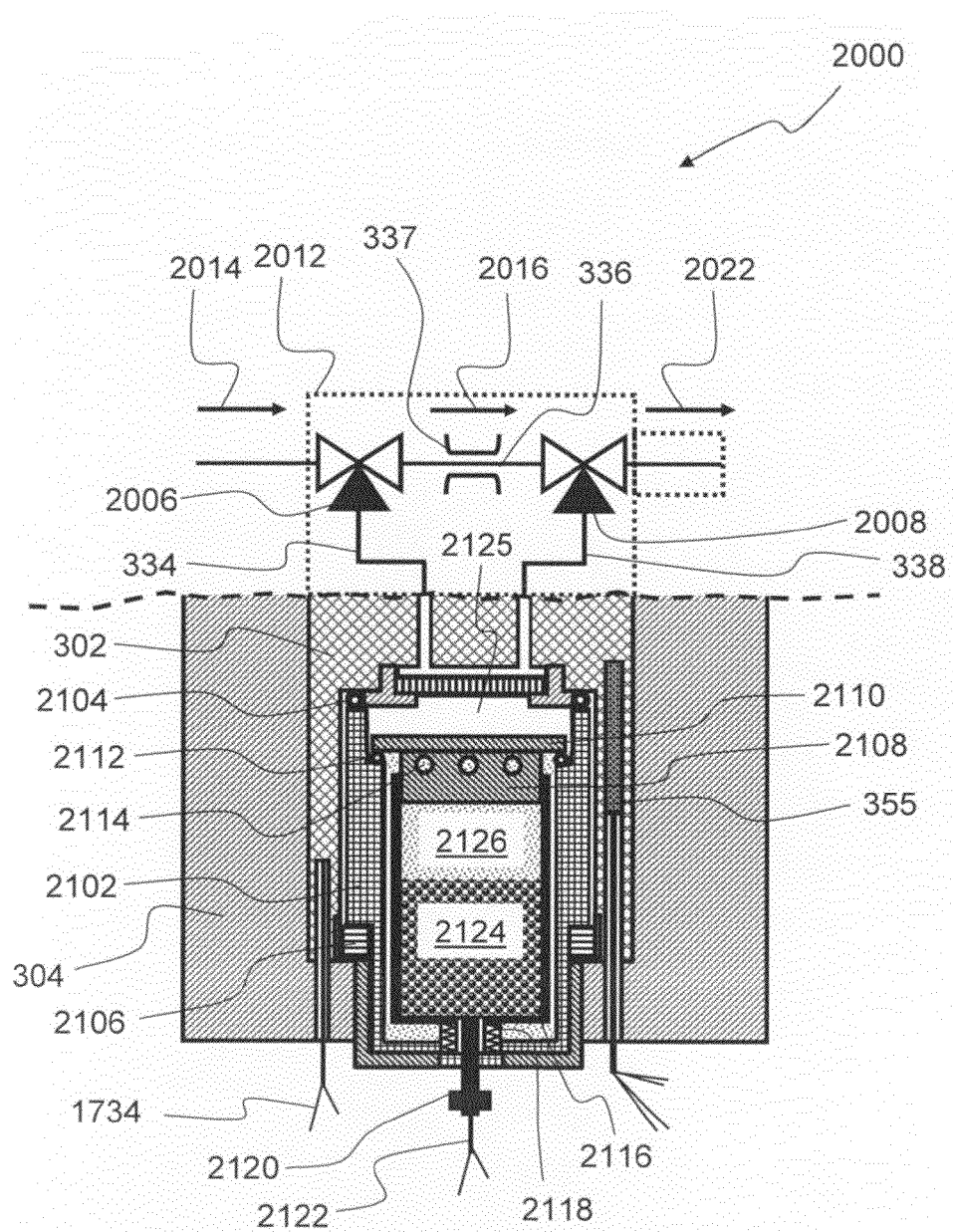
FIG. 21 is a schematic drawing depicting a sealable precursor cartridge in a closed position.

FIG. 20 depicts a heated precursor source (or source system) suitable for a sealable precursor cartridge. The heated precursor source 2000 comprises a source body (or framework) 302, thermal insulator 304 for the source body, a heater cartridge 355 with an electrical power connection 362 and thermocouple connection 364 for measuring the heater cartridge temperature, a thermocouple connection 1734 for measuring the temperature of the source body 304, space for a sealable precursor cartridge 2002, a purge inlet conduit 371, a source by-pass conduit 336, a source outlet conduit 342, a by-pass flow restrictor 337, a cartridge inlet conduit 334 and a cartridge outlet conduit 338. Pulsing valves 2006, 2008 are within the heated area 2012 of the precursor source. Source outlet conduit 342 is surrounded by thermal insulation and the conduit is passively heated utilizing heat energy arriving from the direction of a reaction chamber heater (not shown). The heated precursor source 2000 may also comprise threads 2004 for a lock nut (FIG. 21). Because the source inlet valve 2006 and the source outlet valve 2008 are closed, inactive carrier/purge gas can only flow through the purge inlet conduit 371 to the source by-pass conduit 336 and further to the source outlet conduit 342. The direction of flow is shown by the arrows 2014, 2016 and 2022. The by-pass flow restrictor 337 (e.g., a 20 mm long glass capillary having a 0.6 mm hole) has limited flow conductance compared to the nearby conduits. Thus, the pressure of the conduit to the upstream of the by-pass flow restrictor is higher (e.g., 3-10 hPa higher) than the pressure of the conduit to the downstream of the by-pass flow restrictor.

FIG. 21 depicts a sealable precursor cartridge in a closed position. According to one embodiment the sealable precursor cartridge assembly comprises a cartridge casing 2102, a casing seal 2104 (e.g., an o-ring), a lock nut 2106 for the casing, a cartridge adapter 2108 with holes 2114 and with a tight tolerance fitting against the cartridge casing 2102, a cartridge cap 2110, a cartridge seal 2112 (e.g., an o-ring), a cartridge body 2116, an adjustment bellows 2118, an adjustment stem or screw 2120 for lifting and lowering the cartridge body together with the cartridge cap 2110, and a cartridge thermocouple 2122 for measuring the temperature of the cartridge body 2116. Due to the cartridge seal 2112 precursor vapor can not enter a lifter space 2125 from the gas space 2126 via holes 2114.

The precursor source body 2102 is first heated with the heater cartridge 355 to a sufficiently high temperature (e.g., 80-150° C. depending on the desired precursor temperature). The maximum allowed temperature of the heater cartridge 355 is programmed by the operator of the precursor source. Typically, the maximum allowed temperature is about +50° C. higher than the desired source body temperature. When power to the heater cartridge 355 is switched on, the temperature of the heater cartridge increases and heat energy starts to stream from the heater cartridge 355 at higher temperature to the source body 2102 at lower temperature. If the temperature of the heater cartridge 355 reaches the programmed maximum allowed temperature, power to the heater cartridge is switched off. The source body 302 has high thermal conductivity and temperatures between the parts of the source body tend to become even. Because the source body 302 is covered with thermal insulation 304, the temperature of the source body 302 is maintained with little heating power. It is advantageous to keep the bottom of the precursor cartridge at a lower temperature (e.g., 1-5° C. lower) than the source body 302. The bottom side of the precursor cartridge has less thermal insulation than the source body 302. The coldest spot of the precursor source is thus formed to the bottom of the precursor cartridge. The vapor pressure of a source chemical has the lowest value near the coldest spot within a closed gas volume. Because the coldest spot of the source system is away from the cartridge inlet 334 and cartridge outlet 338 conduits, condensation of the source chemical to the said conduits is avoided.

According to one embodiment, the source body 302 is first heated to a source temperature, and then the cartridge casing 2102 holding the precursor cartridge 2116 filled with liquid or solid precursor 2124 is sealed with the casing o-ring 2104 against the source body 302 by tightening the threaded lock nut 2106 of the casing. Residual air is removed from the lifter space 2125 by purging the space 2125 with inactive gas. Source inlet valve 2006 and source outlet valve 2008 are opened and the flow rate of the inactive gas coming through the purge inlet conduit 371 is altered between the low value (e.g., 100 sccm) and the high value (e.g., 1000 sccm) to generate fluctuating pressure at the conduits 334 and 338 and within the lifter space 2125. Pressure variations carry residual air away from the heated source.

Figure 22:
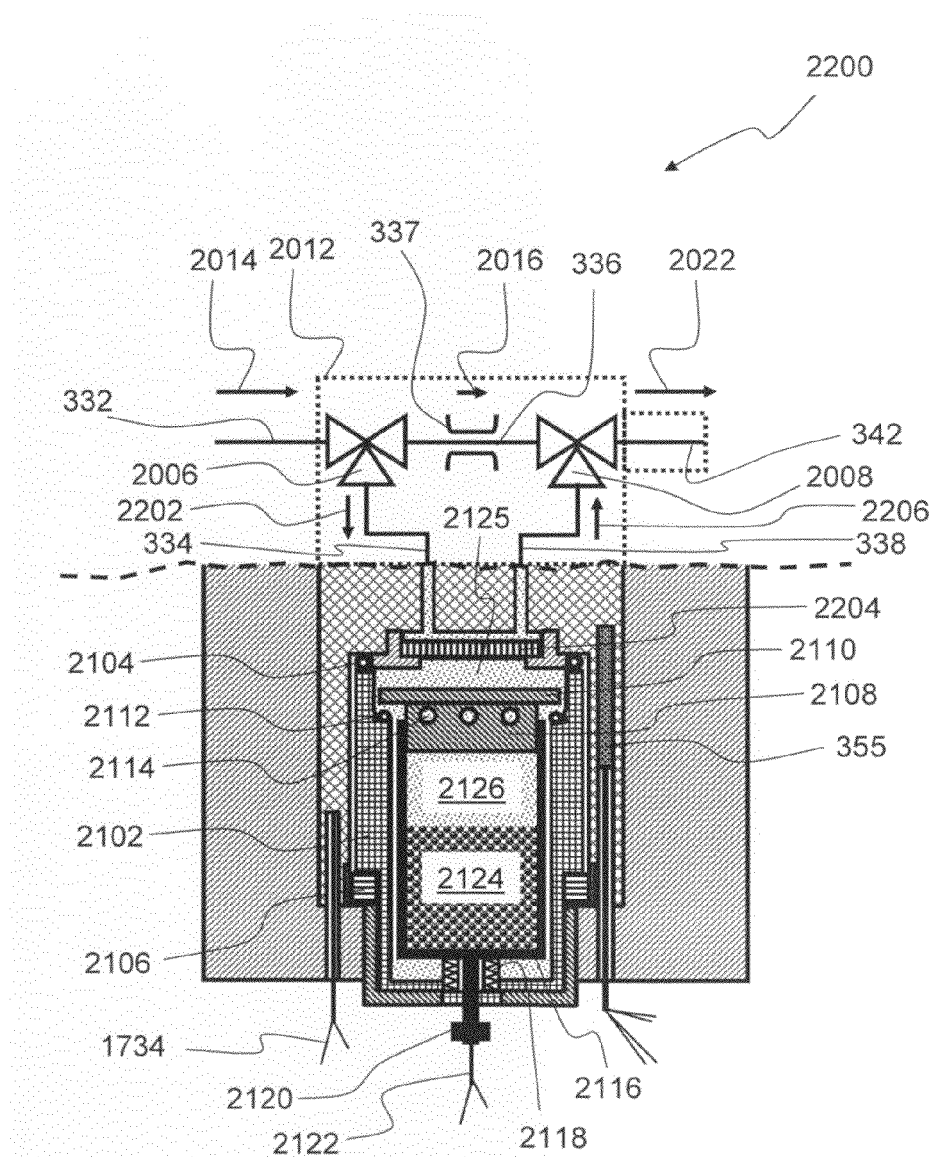
FIG. 22 is a schematic drawing depicting a sealable precursor cartridge in an open position.

FIG. 22 depicts the sealable precursor cartridge in an open position. After purging the cartridge assembly (the cartridge adapter 2108, the cartridge cap 2110 and the cartridge body 2116) is lifted with the adjustment stem or screw 2120 until there is a sufficiently large gap (e.g., 2-5 mm) between the cartridge cap 2110 and the cartridge seal 2112. Precursor vapor flows and/or diffuses from the vapor space 2126 of the precursor cartridge via the holes 2114 through the said gap to the lifter space 2125 and further through the optional particle filter 2204 to the cartridge inlet conduit 334 and cartridge outlet conduit 338. During the pulse time the source inlet valve 2006 and the source outlet valve 2008 are kept open. With the help of the by-pass flow restrictor 2020, the pressure of the inactive gas at the purge inlet conduit 371 is kept at a higher value than the pressure of the precursor vapor at the cartridge inlet conduit 334. As a result, inactive gas flowing along the inlet conduit 334 as indicated with the arrow 2202 pushes precursor vapor towards the cartridge outlet conduit 338 as indicated with the arrow 2206. The mixture of precursor vapor and inactive gas flows through the opened source outlet valve 2008 and is then pushed with the small inactive gas flow coming along the by-pass line 336 as indicated with the arrow 2016 towards the source outlet conduit as indicated with the arrow 2022 and further towards the reaction chamber (not shown). The length of the arrows 2014, 2016, 2022, 2202 and 2008 are in proportion to the actual flows.

The presented heated precursor source systems are suitable, for example, for generating precursor vapor from solid or liquid chemicals that have a vapor pressure of at least about 0.5 hPa at temperatures below about 200° C. Chemicals that can be utilized with the presented heated precursor source systems comprise metal halides (e.g. $AlCl_3$, $TaCl_5$), cyclopentadienylmetals and derivatives of cyclopentadienylmetals (e.g., bis(cyclopentadienyl)ruthenium $Cp_2Ru$, tris(methylcyclopentadienyl)scandium $(CH_3Cp)_3Sc$, bis(methyl-$\eta^5$-cyclopentadienyl)magnesium), metal alkoxides (e.g., titanium isopropoxide $Ti(O^iPr)_4$, tantalum pentaethoxide $Ta(OEt)_5$), metalbetadiketonates (e.g. tris(2,2,6,6-tetramethyl-3,5-heptanedionato) lanthanum $La(thd)_3$, bis(acetylacetonato) nickel $Ni(acac)_2$, alkylamido metals (e.g., tetrakis(ethylmethyl)amido hafnium $[(EtMe)N]_4Hf$, also known as TEMAH).

Thin films that can be deposited with precursor vapor obtained from heated precursor source(s) comprise binary metal oxides, such as group IIA oxides comprising magnesium oxide MgO, group IIIB oxides comprising scandium oxide $Sc_2O_3$, yttrium oxide $Y_2O_3$, lanthanum oxide $La_2O_3$ and lanthanide oxides, e.g. gadolinium oxide $Gd_2O_3$, group IVB oxides comprising titanium dioxide $TiO_2$, zirconium dioxide $ZrO_2$ and hafnium dioxide $HfO_2$, group VB oxides comprising tantalum pentoxide $Ta_2O_5$, group VIB oxides comprising tungsten trioxide $WO_3$, group VIIB oxides comprising manganese (III) oxide $Mn_2O_3$, group 8 oxides comprising ruthenium dioxide $RuO_2$, group IB oxides comprising nickel (II) oxide NiO, copper (II) oxide CuO, group IIB oxides comprising zinc oxide ZnO, group IIIA oxides comprising aluminum oxide $Al_2O_3$, group IVA oxides comprising silicon dioxide $SiO_2$ and tin dioxide $SnO_2$, and group VA oxides comprising bismuth oxide $Bi_2O_3$, ternary and quaternary metal oxides of said groups, such as metal aluminates and metal silicates, solid solutions of metal oxides and metal oxide nanolaminates of said groups, such as $Al_2O_3/HfO_2$, metal nitrides, such as group IIIB nitrides comprising lanthanum nitride LaN, group IVB nitrides comprising titanium nitride TiN, group VB nitrides comprising niobium nitride NbN and tantalum nitride $Ta_3N_5$, group VI nitrides comprising molybdenum nitride MoN, group IIIA nitrides comprising aluminum nitride AlN, group IVA nitrides comprising silicon nitride $Si_3N_4$, and other metal compounds comprising tungsten nitride carbide $WN_xC_y$.

The source temperature of the heated precursor source can be selected in some embodiments from a range of approximately 40-200° C. It is to be noted that this range is only a typical range at the moment, also higher temperatures may be appropriate in other embodiments. The operating pressure of the heated precursor source is usually in the range of approximately 0.5-50 hPa during a deposition process, although lower or higher source pressures are possible in other embodiments. The heated precursor source(s) can be used for depositing thin films on single substrates such as 3"-12" silicon wafers, multiple substrates on a batch process reactor such as 2-50 pieces of 3"-12" silicon wafers, powders in a powder cartridge reactor such as 1-1000 g of 10 µm-1 mm $SiO_2$. The heated precursor source(s) can be used for continuous feeding of precursor vapor in CVD reactors or preferably for pulsed feeding of precursor vapor in ALD reactors. Typically 1-3 heated precursor sources are attached to the ALD reactor. In some embodiments more than 3 heated precursor sources are attached to a reactor. The capacity of the heated precursor source is typically 1-100 g of source chemical although in some embodiments more than 100 g of source chemical are loaded into the source container for production purposes.

Choice of construction material depends on the source chemicals. Aluminum, stainless steel AISI 316L, titanium, nickel and hastelloy serve as examples of the construction materials.

In certain embodiments of the invention the whole heated precursor source together with a heater and heat insulators can easily be attached to the reactor and removed from the reactor for refilling of the source. Another benefit is that the temperature of the source system can be controlled with a simple single heater.

EXAMPLES

The following examples give further illustration of certain embodiments.

Example 1

Vapor-Generating Capacity of the Heated Precursor Source

Conversion Factors:
$100 \text{ cm}^3 = 0.1 \text{ dm}^3 = 1*10^{-4} \text{ m}^3$
1 mbar=100 Pa=1 hPa Tetrakis(ethylmethylamido)hafnium, also known as TEMAH, is used as a source chemical. When the equilibrium vapor pressure of the precursor is 3 hPa at about +104° C. and the line pressure is 15 hPa, the resulting gas-vapor mixture contains 3 hPa/15 hPa*100 vol.-%=20 vol.-% of precursor vapor. The vapor phase volume of the precursor cartridge is 100 cm$^3$. If the source pressure is lowered to 5 hPa during the pulse, (15 hPa−5 hPa)/15 hPa*100%=67% of the precursor vapor is guided out of the precursor cartridge. 67%*3 hPa*100 cm$^3$=200 mbar*cm$^3$.

When the source temperature is +104° C. (377 K), according to ideal gas law pV=nRT→n=pV/RT=200 Pa*1*10$^{-4}$ m$^3$/(8.31441 Jmol$^{-1}$K$^{-1}$*377 K)=200 N/m2*1*10$^{-4}$ m$^3$/(8.31441 Nmmol$^{-1}$K$^{-1}$*377 K)=0.02 Nm/3135 Nmmol$^{-1}$=0.00000638 mol and m(TEMAH)=411.89 g/mol*0.00000638 mol=0.00263 g=2.63 mg In this example it is assumed that 25% of the precursor vapor chemisorbs on the substrate surface and 75% of the precursor vapor is lost to the growth of thin film on the reaction chamber walls or directly to the exhaust line of the ALD reactor. The maximum density of HfO2 is 9.68 g/cm$^3$ (equal to 9.68 mg/mm$^3$=9.68*10$^{-9}$ mg/µm$^3$). According to literature the growth rate of HfO$_2$ from TEMAH and H$_2$O is 0.06 nm/cycle at +300° C. Thus, the amount of added $HfO_2$ on a smooth 1 $cm^2$ surface is 0.06 nm*0.01*$10^9$ nm*0.01*$10^9$ nm=6*$10^{12}$ $nm^3$=6000 $\mu m^3$ and the mass is 9.68*$10^{-9}$ mg/$\mu m^3$*6000 $\mu m^3$=0.0000581 mg. The molar mass of hafnium dioxide $M(HfO_2)$ is 210.49 g/mol and the molar mass of TEMAH is 411.89 g/mol. Thus, 411.89 g/mol/210.49 g/mol*0.0000581 mg=0.00011 mg of TEMAH is needed for covering 1 $cm^2$ of smooth surface and with 25% chemisorption efficiency 0.00045 mg of TEMAH vapor must be fed to the reaction chamber for covering 1 $cm^2$ of smooth substrate surface. The precursor source delivers 2.66 mg of TEMAH during the precursor pulse and thus it is capable of covering 2.66 mg/0.00045 mg/$cm^2$=5900 $cm^2$ of smooth substrate surface which is sufficient for processing a batch of 75 pieces of 4-inch wafers. It can be estimated that a heated precursor source with a vapor space reduced by 90% from 100 $cm^3$ to 10 $cm^3$ loaded with a source chemical with a vapor pressure reduced by 80% from 3 hPa to 0.5 hPa provide already enough precursor vapor for depositing a thin film on 5900 $cm^2$*0.1*0.2=118 $cm^2$ which is enough for coating a single 100 mm (4-inch) wafer. The temperature of the source system is measured with a thermocouple that is placed near the bottom of the source cartridge. The source system is heated with a resistive heater that is placed within the source framework. The heater comprises an internal thermocouple for measuring the heater temperature. Power consumption of the heater is typically in the range of 50-500 W, preferably 100-200 W. Such a low power consumption means that 24 VDC power source with PID temperature controller can be used for driving the heater although in other embodiments pulsed line AC voltage is used with a temperature controller for driving the heater. Source outlet conduit is heated passively from two directions. Heat is moving by conduction from the source framework towards the bottom part of the source outlet conduit and by radiation and convection from the reaction chamber heater to the upper part of the source outlet conduit. Heat losses are minimized with heat insulating layers and with contoured design of the feed-through projection. The feed-through projection extends from the intermediate space of the reactor to the feed-through flange. Outer empty gap between the outer feed-through projection and the inner feed-through projection lengthens the path of heat conduction and thus decreases the amount of heat lost by conduction to the bottom flange of the reactor. Collar-shaped neck insulator circles the seal tightening nut. Inner empty gap between the heat equalizer block and inner feed-through projection makes it difficult for the heat to move from the heat equalizer block to the bottom flange of the reactor. In other embodiments the feed-through area can be equipped with another heater for maintaining the source line temperature above the condensation temperature of the precursor vapor.

The source system is detached without the feed-through projection from the bottom flange of the reactor by removing the neck insulator and loosening the seal tightening nut. The source system is detached with the feed-through projection from the bottom flange of the reactor by loosening the clamping seal.

Silicone rubber foam that stands temperatures up to 200-250° C. serves as an example of a suitable material for the heat insulator. To make a very compact source system, surfaces to be heat insulated can also be coated with a heat insulating ceramic paint such as Supertherm® paint. Supertherm® paint stands about +260° C. continuously and it blocks both heat conduction and infrared radiation. Heat loss by convection is also very small due to solid structure of the dried paint. As a comparison, about 0.25-0.5 mm thick layer of dried ceramic paint is enough for insulating the framework as efficiently as 100 mm thick piece of rubber foam.

The source cartridge comprises cartridge body, a cartridge seal and an optional particle filter. A threaded cartridge flange with a tip pushes the cartridge body against the source framework and the cartridge seal pressed between the cartridge body and the source framework makes the cartridge leak tight against room air. The cartridge seal can be an o-ring made of e.g. Viton rubber or perfluorinated rubber (such as Kalrez®, Simriz® or Chemraz®) that stand temperatures up to 200-230° C. Other materials suitable for the seals in the source can be selected, e.g., from Eriks o-ring technical manual.

The tip of the source conduit can be attached to the reaction chamber for example by tolerance fitting, VCR fitting or metal ferrule fitting.

Example 2

Deposition of a Tantalum Pentoxide $Ta_2O_5$ with a Heated Precursor Source

Tantalum pentaethoxide $Ta(OEt)_5$ and water were used as precursors for the deposition of $Ta_2O_5$ thin film on 4" silicon substrate within the reaction space of the SUNALE™ R-150 ALD reactor manufactured by Picosun Oy, Finland. $Ta(OEt)_5$ is viscous liquid near room temperature and it has a vapor pressure of 10 hPa at +120° C., wherein 1 hPa=100 Pa=1 mbar. Because $Ta(OEt)_5$ has negligible vapor pressure near room temperature, a heated precursor source was used for obtaining sufficient source vapor pressure at elevated source temperatures. $Ta(OEt)_5$ was loaded with a needle and a syringe into a glass cartridge that was pushed to the radial axis seal of the heated precursor source. Water is liquid at room temperature and it has a vapor pressure of 23 hPa at 20° C. Liquid precursor source was used for vaporizing water near room temperature 25° C.

A 100-mm silicon wafer was used as a substrate. The substrate was placed to the substrate holder and the holder was lowered to the reaction chamber of the ALD reactor. The reaction space and the intermediate space were pumped down to below 1 hPa absolute pressure with a mechanical vacuum pump. While the vacuum pump was running the pressure of the reaction space was adjusted with flowing nitrogen gas to a pressure range of approximately 1-3 hPa. The pressure of the intermediate space was kept about 3-5 hPa higher than the pressure of the reaction space, so that precursor vapor could not leak from the reaction space to the intermediate space. In other embodiments different kind of pressure ranges are feasible, as long as gases can be removed quickly enough from the reaction space to the exhaust line and reactive gases cannot leak towards the intermediate space. The reaction space had been preheated to 300° C. in order to speed up the heating of the substrate. After the pressure had stabilized within the reaction space, the process control waited for about 5 minutes until the temperatures within the reaction space had become even.

The deposition cycle consisted of four basic sequential steps: $Ta(OEt)_5$ vapor exposure period (0.2 s), a first removal period (2.0 s), $H_2O$ vapor exposure period (0.1 s) and a second removal period (4.0 s). When the process control unit had completed the deposition sequence consisting of 1000 identical deposition cycles, the pumping valves were closed and the reactor was vented with pure nitrogen gas to atmospheric pressure. The substrate holder was lifted from the reaction chamber and the substrate was unloaded from the substrate holder for measurements. As a result of the deposition experiment, a $Ta_2O_5$ thin film with a thickness of 40 nm was obtained on the substrate. The growth rate of $Ta_2O_5$ was 0.07 nm/cycle at 300° C.

Example 3

Deposition of a Doped Metal Oxide Thin Film with Three Precursor Sources

The ALD reactor was equipped with one Picosolution™ precursor source loaded with diethylzinc (DEZ), one Picosolution™ precursor source loaded with purified water and one Picohot™ source system loaded with bis(methyl-$\eta^5$-cyclopentadienyl)magnesium (CPMM). CPMM source was heated to +95° C. resulting in a vapor pressure of about 10 hPa. The water source temperature was controlled with a peltier element cooler so that the temperature of the water source was preferably slightly below the room temperature, although temperatures above the room temperature can be used in other embodiments provided that the source line is sufficiently insulated for preventing condensation of water. In this deposition example the temperature of the cooled water source was +18° C.

The reaction chamber of the ALD reactor was heated to +250° C. A 6-inch silicon wafer was loaded into the reaction chamber. About 5 minutes were set to the stabilization timer in order to stabilize the temperature of the wafer to the reaction chamber temperature.

Water vapor was first pulsed to the reaction chamber to saturate the substrate surface with hydroxyl (OH) groups. According to other embodiments it is also possible to start the pulsing directly with the metal precursor because substrate surfaces typically contain enough OH groups to initiate the thin film growth.

Next, the deposition program fed pulses of DEZ, CPMM and water vapor separated with nitrogen purge gas into the reaction chamber. As a result, n-type ZnO thin film doped with Mg was grown on the wafer with a growth rate of 2 Å/cycle.

It should be noted that certain advantages have been described above. Of course, it is to be understood that not necessarily all such advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Moreover, although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. In addition, while a number of variations of the invention have been shown and described in detail, other modifications, which are within the scope of this invention, will be readily apparent to those of skill in the art based upon this disclosure. For example, it is contemplated that various combinations or sub combinations of the specific features and aspects of the embodiments may be made and still fall within the scope of the invention. Accordingly, it should be understood that various features and aspects of the disclosed embodiments can be combined with or substituted for one another in order to form varying modes of the disclosed invention. Thus, it is intended that the scope of the present invention herein disclosed should not be limited by the particular disclosed embodiments described above, but should be determined only by a fair reading of the claims that follow.

We claim:

1. An apparatus comprising:
a deposition reactor comprising a vacuum chamber enclosing a sealable reaction chamber; a reaction chamber heater placed in the vacuum chamber;
a precursor source configured for depositing material on a heated substrate in the deposition reactor by sequential self-saturating surface reactions;
an in-feed line for feeding precursor vapor from the precursor source through the vacuum chamber to the sealable reaction chamber, the in-feed line going through a vacuum chamber wall of the reactor; and
a structure configured to utilize heat from the reaction chamber heater for preventing condensation of precursor vapor into liquid or solid phase between the precursor source and the sealable reaction chamber, said structure comprising:
a protruding internal neck arranged around said in-feed line, and said protruding internal neck protruding through said vacuum chamber wall; and
an outer neck around the protrusion, the internal neck and the outer neck forming a gap there between.

2. The apparatus of claim 1, wherein the precursor source comprises: a protrusion configured for receiving heat from the reactor.

3. The apparatus of claim 2, comprising: a heat conductor tube around the in-feed line.

4. The apparatus of claim 1, comprising: a source framework configured for receiving a detachably attachable source cartridge.

5. The apparatus of claim 4, comprising: a heater for heating the source cartridge.

6. An apparatus comprising:
a deposition reactor comprising a vacuum chamber enclosing a sealable reaction chamber;
a precursor source configured to deposit material on a heated substrate in the deposition reactor by sequential self-saturating surface reactions;
two pulsing valves embedded into the precursor source and configured to control feeding of precursor vapor through an in-feed line from the precursor source through the vacuum chamber to the sealable reaction chamber; and
a bypass line between the pulsing valves for feeding inactive gas from a pulsing valve to another pulsing valve, wherein the pulsing valves are further configured to control feeding of the inactive gas from a pulsing valve to another pulsing valve.

7. The apparatus of claim 6, comprising a flow restrictor in the bypass line.

8. An apparatus comprising:
a deposition reactor comprising a vacuum chamber enclosing a sealable reaction chamber;
a precursor source configured to deposit material on a heated substrate in the deposition reactor by sequential self-saturating surface reactions;
a pulsing valve embedded into the precursor source configured to control feeding of precursor vapor through an in-feed line from the precursor source through the vacuum chamber to the sealable reaction chamber, the apparatus being configured to:
convey inactive gas via the pulsing valve to the precursor source cartridge to raise the pressure inside the precursor source cartridge and to ease subsequent flow of a mixture of precursor vapor and inactive gas towards the reaction chamber.

9. The apparatus of claim 8, wherein the apparatus is configured to: close the precursor cartridge after the pressure raise until the commencement of a next precursor pulse period, and further configured to: open a route towards the reaction chamber via the pulsing valve upon commencement of the next precursor pulse period.

10. The apparatus of claim 3, comprising: an air gap around the heat conductor tube configured for decreasing thermal energy loss.

11. An apparatus comprising:
- a deposition reactor comprising a vacuum chamber enclosing a sealable reaction chamber;
- a reaction chamber heater placed in the vacuum chamber;
- a precursor source configured for depositing material on a heated substrate in the deposition reactor by sequential self-saturating surface reactions;
- an in-feed line for feeding precursor vapor from the precursor source through the vacuum chamber to the sealable reaction chamber;
- a protrusion attached to a wall of the vacuum chamber and coupled to the precursor source, through which the in-feed line passes and extends through the vacuum chamber wall into the reactor, the protrusion comprises an internal neck configured to utilize heat from the reaction chamber heater for preventing condensation of precursor vapor into liquid or solid phase between the precursor source and the sealable reaction chamber, the internal neck is arranged around the in-feed line substantially extending from the precursor source and protruding through the vacuum chamber wall; and
- an outer neck arranged around the protrusion, wherein the internal neck and outer neck form a gap there between.

12. The apparatus of claim 11, further comprising an outer neck arranged around the protrusion.

13. The apparatus of claim 12, wherein the internal neck and outer neck form a gap there between.

14. The apparatus of claim 13, wherein the protrusion further comprises a neck connector.

15. The apparatus of claim 14, wherein the neck connector comprises a pair of flanges with at least one seal.

16. The apparatus of claim 11, wherein the internal neck contacts the in-feed line on the reaction chamber side of the vacuum wall.

17. The apparatus of claim 11, further comprising a coaxial heat conductor tube that is positioned within the internal neck and arranged around the in-feed line extending substantially from the precursor source and protruding through the vacuum chamber wall.

18. The apparatus of claim 11, further comprising two pulsing valves embedded into the precursor source and configured to control feeding of precursor vapor from the precursor source to a reaction chamber comprised by the reactor containing the substrate; and a bypass line between the pulsing valves for feeding inactive gas from a pulsing valve to another pulsing valve, wherein the pulsing valves are further configured to control feeding of the inactive gas from a pulsing valve to another pulsing valve.

19. The apparatus of claim 11, further comprising a pulsing valve embedded into the precursor source configured to control feeding of precursor vapor from the precursor source to a reaction chamber comprised by the reactor containing the substrate, the apparatus being configured to: convey inactive gas via the pulsing valve to the precursor source cartridge to raise the pressure inside the precursor source cartridge and to ease subsequent flow of a mixture of precursor vapor and inactive gas towards the reaction chamber.

\* \* \* \* \*